United States Patent
Lee et al.

(10) Patent No.: US 11,816,282 B2
(45) Date of Patent: Nov. 14, 2023

(54) TOUCH DISPLAY DEVICE

(71) Applicant: LG DISPLAY CO., LTD., Seoul (KR)

(72) Inventors: JaeGyun Lee, Paju-si (KR); Ruda Rhe, Paju-si (KR); Hyangmyoung Gwon, Paju-si (KR); JiHyun Jung, Paju-si (KR); DeukSu Lee, Paju-si (KR); SuChang An, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/866,058

(22) Filed: Jul. 15, 2022

(65) Prior Publication Data

US 2023/0116927 A1   Apr. 20, 2023

(30) Foreign Application Priority Data

Oct. 18, 2021   (KR) .................. 10-2021-0138187
Dec. 28, 2021   (KR) .................. 10-2021-0189671

(51) Int. Cl.
*G06F 3/041*       (2006.01)
*G06F 3/044*       (2006.01)

(52) U.S. Cl.
CPC .......... *G06F 3/04164* (2019.05); *G06F 3/0412* (2013.01); *G06F 3/0443* (2019.05)

(58) Field of Classification Search
None
See application file for complete search history.

(56) References Cited

U.S. PATENT DOCUMENTS

| | | | |
|---|---|---|---|
| 2016/0062164 | A1 | 3/2016 | Chae et al. |
| 2018/0358413 | A1* | 12/2018 | Lee et al. ............ H01L 27/323 |
| 2019/0237533 | A1* | 8/2019 | Kim et al. ......... H01L 27/3276 |
| 2021/0200364 | A1 | 7/2021 | Won et al. |
| 2021/0247886 | A1 | 8/2021 | Lee et al. |
| 2021/0382599 | A1* | 12/2021 | Gong et al. .......... G06F 3/0412 |
| 2022/0376213 | A1* | 11/2022 | Ma et al. ............ H01L 51/5284 |

FOREIGN PATENT DOCUMENTS

| | | | |
|---|---|---|---|
| CN | 109933234 | A * | 6/2019 |
| CN | 112698746 | A * | 4/2021 ................G06F 3/0412 |

* cited by examiner

*Primary Examiner* — Duane N Taylor, Jr.
(74) *Attorney, Agent, or Firm* — Fenwick & West LLP

(57) ABSTRACT

A touch display device is disclosed. By arranging a part of a touch routing line for a driving of a touch electrode on an active area and electrically connecting the touch routing line to an auxiliary routing pattern that overlaps the touch routing line, an area where the touch routing line is disposed and a load of the touch routing line can be reduced.

20 Claims, 18 Drawing Sheets

TOUCH DISPLAY DEVICE

CROSS REFERENCE TO RELATED APPLICATIONS

This application claims priority from Republic of Korea Patent Application No. 10-2021-0138187, filed on Oct. 18, 2021, and Republic of Korea Patent Application No. 10-2021-0189671, filed on Dec. 28, 2021, each of which is hereby incorporated by reference in its entirety.

BACKGROUND

Field

Embodiments of the present disclosure are related to a touch display device.

Description of Related Art

Display devices, for providing various functions to a user, detects a touch by a finger or a pen of the user on a display panel, and performs an input process based on the touch detected.

The display devices, for example, can include a plurality of touch electrodes disposed in the display panel. The display devices can drive the plurality of touch electrodes, and can sense the touch of the user by detecting a change of a capacitance generated when the user touches the display panel.

The display devices can include various configurations for displaying an image other than configurations for sensing the touch. Methods are required that the touch electrode can be implemented in the display panel for improving a performance of a touch sensing without reducing a performance of an image displaying of the display devices.

SUMMARY

Embodiments of the present disclosure can provide a touch sensor structure being capable of reducing an area where a touch routing line for a driving of a touch electrode on a display panel is disposed and a load of the touch routing line.

Embodiments of the present disclosure can provide a touch display device including a plurality of light-emitting elements disposed on an active area of a display panel, an encapsulation layer disposed on the plurality of light-emitting elements, a plurality of touch electrodes disposed on the encapsulation layer, a plurality of touch routing lines electrically connected to the plurality of touch electrodes, and a plurality of auxiliary routing patterns disposed on the active area and positioned between the encapsulation layer and the plurality of touch routing lines, an auxiliary routing pattern from the plurality of auxiliary routing patterns electrically connected to at least one of the plurality of touch routing lines at a point on the active area.

Embodiments of the present disclosure can provide a touch display device including an active area including a first sub-area and a second sub-area, a plurality of touch electrodes disposed divided on each of the first sub-area and the second sub-area, a plurality of touch routing lines including a touch routing line electrically connected to at least one touch electrode from the plurality of touch electrodes disposed on the first sub-area, the touch routing line disposed in both the first sub-area and the second sub-area; and a plurality of auxiliary routing patterns disposed on the second sub-area, the plurality of auxiliary routing patterns including an auxiliary routing pattern that is electrically connected to the touch routing line and overlapping the touch routing line in the second sub-area, the auxiliary routing pattern having a width that is greater than a width of the touch routing line.

In one embodiment, a touch display device comprises: an active area including a first sub-area and a second sub-area that is non-overlapping with the first sub-area; a plurality of touch electrodes including a first touch electrode disposed in the first sub-area but not the second sub-area and a second touch electrode disposed in the second sub-area but not the first sub-area; a plurality of touch routing lines including a first touch routing line connected to the first touch electrode and disposed in the first sub-area and the second sub-area, and a second touch routing line connected to the second touch electrode and disposed in the second sub-area but not the first sub-area; and an auxiliary routing pattern disposed in the second sub-area but the not first sub-area, the auxiliary routing pattern electrically connected to the first touch routing line in the active area but not electrically connected the second touch routing line, and the auxiliary routing pattern overlapping the first touch routing line in the second sub-area without overlapping the second touch routing line.

According to various embodiments of the present disclosure, by arranging a part of a touch routing line on an active area and electrically connecting to an auxiliary routing pattern positioned on an area overlapping the touch routing line, an area where the touch routing line is disposed is reduced and a load of the touch routing line can be reduced.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
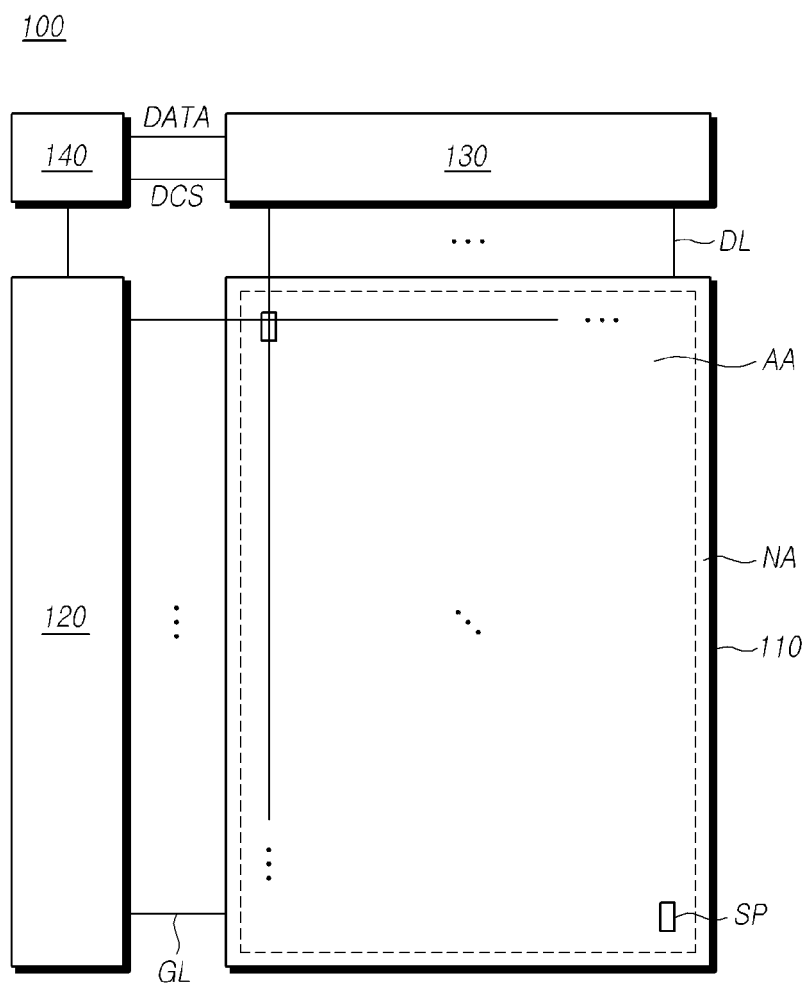
FIG. 1 is a diagram schematically illustrating a configuration of a touch display device according to an embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to accompanying drawings.

Figure 2:
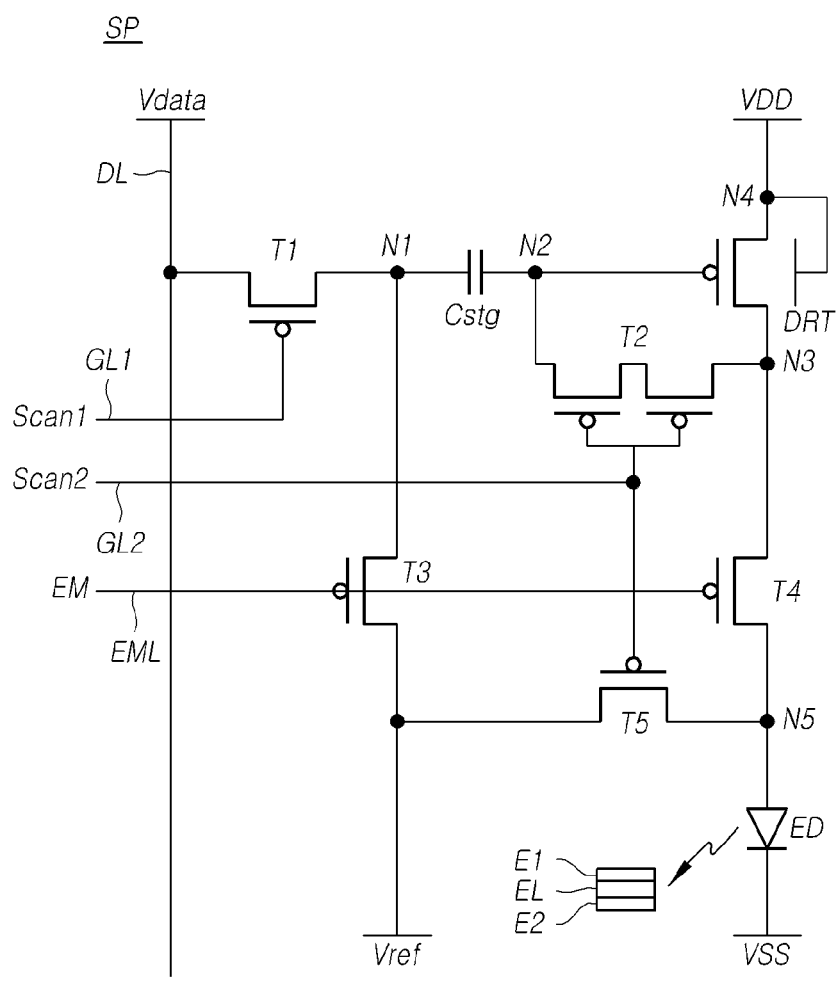
FIG. 2 is a diagram illustrating an example of a circuit structure of a subpixel included in a touch display device according to an embodiment of the present disclosure.

FIG. 1 is a diagram schematically illustrating a configuration of a touch display device 100 according to an embodiment of the present disclosure. FIG. 2 is a diagram illustrating an example of a circuit structure of a subpixel SP included in the touch display device 100 according to an embodiment of the present disclosure.

Referring to FIG. 1, the touch display device 100 can include a display panel 110, and a gate driving circuit 120, a data driving circuit 130, and a controller 140 for driving the display panel 110. The touch display device 100 can further include a configuration for a touch sensing other than a configuration for a display driving.

The display panel 110 can include an active area AA where a plurality of subpixels SP are disposed to display an image, and a non-active area which is located outside the active area AA. The non-active area does not display an image. A plurality of gate lines GL and a plurality of data lines DL can be arranged on the display panel 110. The plurality of subpixels SP can be located in areas where the gate lines GL and the data lines DL intersect each other.

The gate driving circuit 120 can be controlled by the controller 140. The gate driving circuit 120 can sequentially output scan signals to the plurality of gate lines GL arranged on the display panel 110, thereby controlling the driving timing of the plurality of subpixels SP.

The gate driving circuit 120 can include one or more gate driver integrated circuits GDIC. The gate driving circuit 120 can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate drive integrated circuit GDIC can be implemented by a gate-in-panel GIP method to then be directly arranged on the display panel 110. Alternatively, the gate driver integrated circuit GDIC can be integrated and arranged on the display panel 110. Alternatively, each gate driver integrated circuit GDIC can be implemented by a chip-on-film COF method in which an element is mounted on a film connected to the display panel 110.

The data driving circuit 130 can receive image data DATA from the controller 140 and convert the image data DATA into an analog data voltage Vdata. The data driving circuit 130 can output the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC. Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit SDIC can be directly disposed on the display panel 110. Alternatively, the source driver integrated circuit SDIC can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 can supply various control signals to the gate driving circuit 120 and the data driving circuit 130, and control the operation of the gate driving circuit 120 and the data driving circuit 130.

The controller 140 can be mounted on a printed circuit board, a flexible printed circuit, or the like. The controller 140 can be electrically connected to the gate driving circuit 120 and the data driving circuit 130 through the printed circuit board, the flexible printed circuit, or the like.

The controller 140 can allow the gate driving circuit 120 to output a scan signal according to the timing implemented in each frame. The controller 140 can convert a data signal received from the outside (e.g., a host system) to conform to the data signal format used in the data driving circuit 130 and then output the converted image data DATA to the data driving circuit 130.

The controller 140 can receive, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP can control operation start timing of one or more gate driver integrated circuits GDIC constituting the gate driving circuit 120. The gate shift clock GSC, which is a clock signal commonly input to one or more gate driver integrated circuits GDIC, can control the shift timing of a scan signal. The gate output enable signal GOE can specify timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP can control a data sampling start timing of one or more source driver integrated circuits SDIC constituting the data driving circuit 130. The source sampling clock SSC can be a clock signal for controlling the timing of sampling data in the respective source driver integrated circuits SDIC. The source output enable signal SOE can control the output timing of the data driving circuit 130.

The touch display device 100 can further include a power management integrated circuit for supplying various voltages or currents to the display panel 110, the gate driving circuit 120, the data driving circuit 130, and the like or controlling various voltages or currents to be supplied thereto.

Each subpixel SP is an area defined by a cross of the gate line GL and the data line DL, and depending on types of the touch display device 100, a liquid crystal layer or an element emitting a light can be disposed on the subpixel SP.

For example, in the case that the touch display device 100 is an organic light-emitting display device, an organic light-emitting diode OLED and various circuit elements can be disposed on the plurality of subpixels SP. As controlling a current supplied to the organic light-emitting diode OLED disposed on the subpixel SP by the various circuit elements, each subpixel SP can represent a luminance corresponding to an image data.

Alternatively, in some cases, a light-emitting diode LED, micro light-emitting diode μLED or a quantum dot light-emitting diode can be disposed on the subpixel SP.

Referring to FIG. 2, each of the plurality of subpixels SP can include a light-emitting element ED. The subpixel SP can include a driving transistor DRT controlling a driving current supplied to the light-emitting element ED.

The subpixels SP can include at least one circuit element other than the light-emitting element ED and the driving transistor DRT for driving the subpixel SP.

For example, the subpixel SP can include a first transistor T1, a second transistor T2, a third transistor T3, a fourth transistor T4, a fifth transistor T5, and a storage capacitor Cstg.

An example illustrated in FIG. 2 represents 6T1C structure that six transistors and one capacitor are disposed, but embodiments of the present disclosure are not limited to this. The example illustrated in FIG. 2 represents a case that a transistor is a P type, but at least some of the transistors disposed on the subpixel SP can be an N type.

Furthermore, the transistor disposed on the subpixel SP, for example, can include a semiconductor layer made of a low-temperature poly silicon LTPS or a semiconductor layer made an oxide semiconductor. Furthermore, in some cases, a transistor including the semiconductor layer made of the low-temperature poly silicon and a transistor including the semiconductor layer made of the oxide semiconductor can be disposed on the subpixel SP together.

The first transistor T1 can be electrically connected between the data line DL and a first node N1. The first transistor T1 can be controlled by a first scan signal S*can*1 supplied through a first gate line GL1. The first transistor T1 can control that the data voltage Vdata is applied to the first node N1.

The second transistor T2 can be electrically connected between a second node N2 and a third node N3. The second node N2 can be a gate node of the driving transistor DRT. The third node N3 can be a drain node or a source node of the driving transistor DRT. The second transistor T2 can be controlled by a second scan signal S*can*2 supplied through a second gate line GL2. The second transistor T2 can perform an operation compensating a change of a threshold voltage of the driving transistor DRT.

The third transistor T3 can be electrically connected between a line that a reference voltage Vref is supplied and the first node N1. The third transistor T3 can be controlled by a light-emitting control signal EM supplied through a light-emitting control line EML. The third transistor T3 can control that the first node N1 is discharged or the reference voltage Vref is applied to the first node N1.

The fourth transistor T4 can be electrically connected between the third node N3 and a fifth node N5. The fifth node N5 can be a node electrically connected to the light-emitting element ED. The fourth transistor T4 can be controlled by the light-emitting control signal EM supplied through the light-emitting control line EML. The fourth transistor T4 can control the timing that the driving current is supplied to the light-emitting element ED.

The fifth transistor T5 can be the line that the reference voltage Vref is supplied and the fifth node N5. The fifth transistor T5 can be controlled by the second scan signal Scan2 supplied through the second gate line GL2. The fifth transistor T5 can control that the fifth node N5 is discharged or the reference voltage Vref is applied to the fifth node N5.

The driving transistor DRT can be electrically connected between a fourth node N4 and the third node N3. The first node N4 can be electrically connected to a line that a first driving voltage VDD is supplied. The first driving voltage VDD, for example, can be a high-potential driving voltage. The fourth node N4 can be the source node or the drain node of the driving transistor DRT.

The driving transistor DRT can be controlled by a difference between a voltage of the second node N2 and a voltage of the fourth node N4. The driving transistor DRT can control the driving current supplied to the light-emitting element ED.

The driving transistor DRT can include a back gate electrode electrically connected to the fourth node N4. A current output of the driving transistor DRT can be perform stably by the back gate electrode electrically connected to the source node of the driving transistor DRT. The back gate electrode, for example, can be disposed by using a metal layer for blocking that an external light is entered to a channel of the driving transistor DRT.

The light-emitting element ED can be electrically connected between the fifth node N5 and a line that a second driving voltage VSS is supplied. The second driving voltage VSS, for example, can be a low-potential driving voltage.

The light-emitting element ED a first electrode E1 electrically connected to the fifth node N5, a second electrode E2 that the second driving voltage VSS is applied and a light-emitting layer EL disposed between the first electrode E1 and the second electrode E2.

The light-emitting element ED can represent a luminance according to the driving current supplied by the driving transistor DRT. The driving timing of the light-emitting element ED can be controlled by the fourth transistor T4.

Explaining briefly the driving timing of the subpixel SP illustrated in FIG. 2, the second scan signal Scan2 of a turned-on level can be supplied through the second gate line GL2. As the transistor disposed on the subpixel SP is the P type, the turned-on level can be a low level.

The second transistor T2 and the fifth transistor T5 can be turned-on by the second scan signal Scan2 of the turned-on level.

As the second transistor T2 is turned-on, the second node N2 and the third node N3 can be electrically connected. A voltage that the threshold voltage of the driving transistor DRT is reflected to the first driving voltage VDD can be applied to the second node N2 through the second transistor T2. The change of the threshold voltage of the driving transistor DRT can be compensated by this process.

As the fifth transistor T5 is turned-on, the reference voltage Vref can be applied to the fifth node N5. The fifth node N5 can be initialized.

After, the first scan signal Scan1 of the turned-on level can be supplied through the first gate line GL1.

The first transistor T1 can be turned-on by the first scan signal Scan1 of the turned-on level.

As the first transistor T1 is turned-on, the data voltage Vdata can be applied to the first node N1.

It can become a state that the data voltage Vdata and the first driving voltage VDD that the threshold voltage of the driving transistor DRT is reflected are applied to both ends of the storage capacitor Cst.

After, the light-emitting control signal EM can be supplied through the light-emitting control line EML.

The third transistor T3 and the fourth transistor T4 can be turned-on.

As the third transistor T3 is turned-on, a voltage of the first node N1 can be changed to the reference voltage Vref. A voltage of the second node N2 coupled with the first node N1 can be changed according to the change of the voltage of the first node N1.

It can become a state that a voltage that the threshold voltage of the driving transistor DRT and the data voltage Vdata are reflected to the first driving voltage VDD is applied to the second node N2, and it can become a state that the first driving voltage VDD is applied to the fourth node N4. A difference between a voltage of the second node N2 and a voltage of the fourth node N4 can be a voltage that the data voltage Vdata and the threshold voltage of the driving transistor DRT are reflected. The driving current corresponding to the data voltage Vdata can be supplied by the driving transistor DRT.

As the fourth transistor T4 is turned-on, the driving current supplied by the driving transistor DRT can be supplied to the light-emitting element ED.

The light-emitting element ED can represent a luminance according to the driving current, and the subpixel SP including the light-emitting element ED can display an image corresponding to the image data.

Furthermore, embodiments of the present disclosure can provide a function of sensing a touch of a user on the display panel 110 by implementing a touch sensor structure on the display panel 110 displaying an image.

Figure 3:
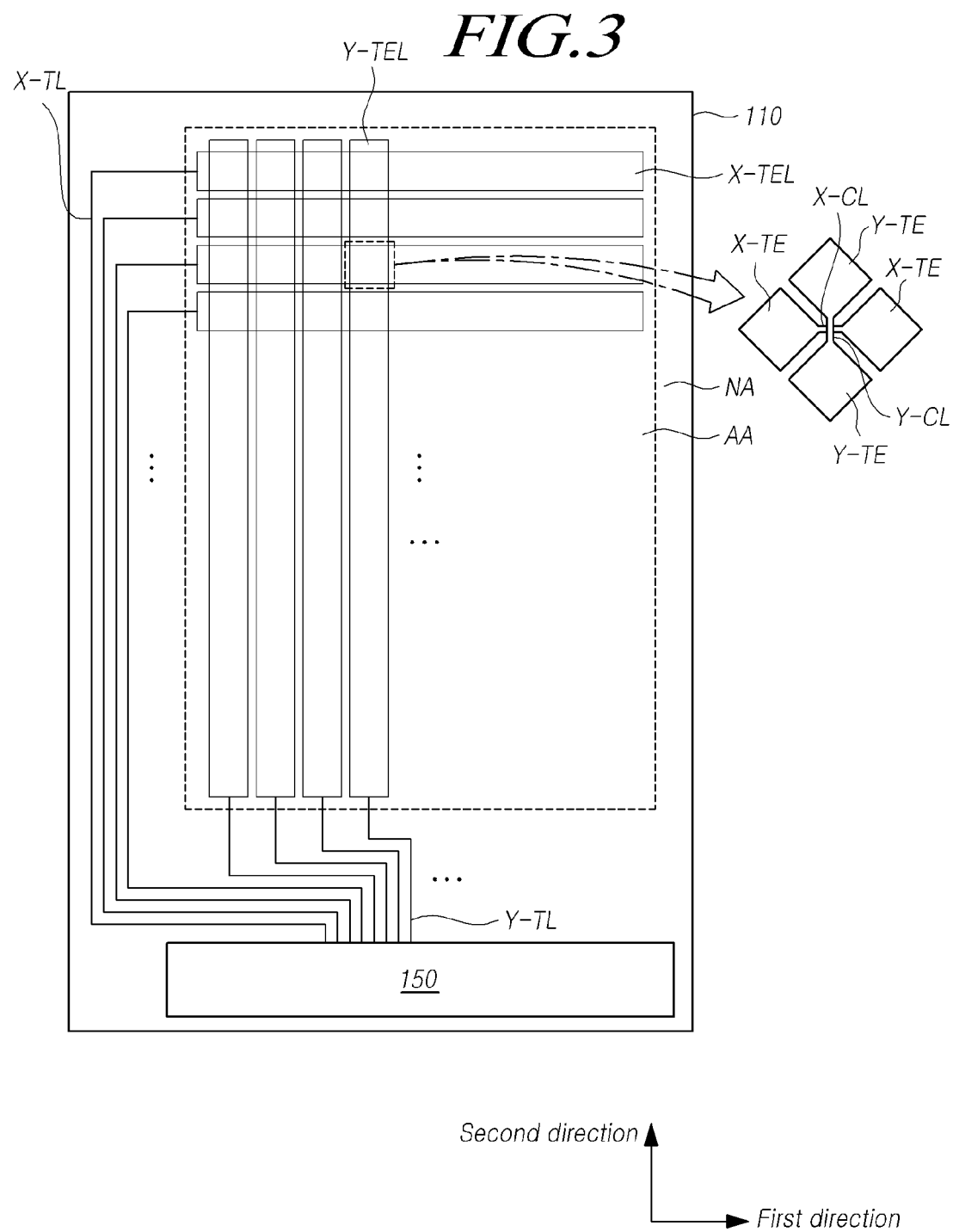
FIGS. 3 to 5 are diagrams illustrating examples of a touch sensor structure included in a touch display device according to an embodiment of the present disclosure.
Figure 4:
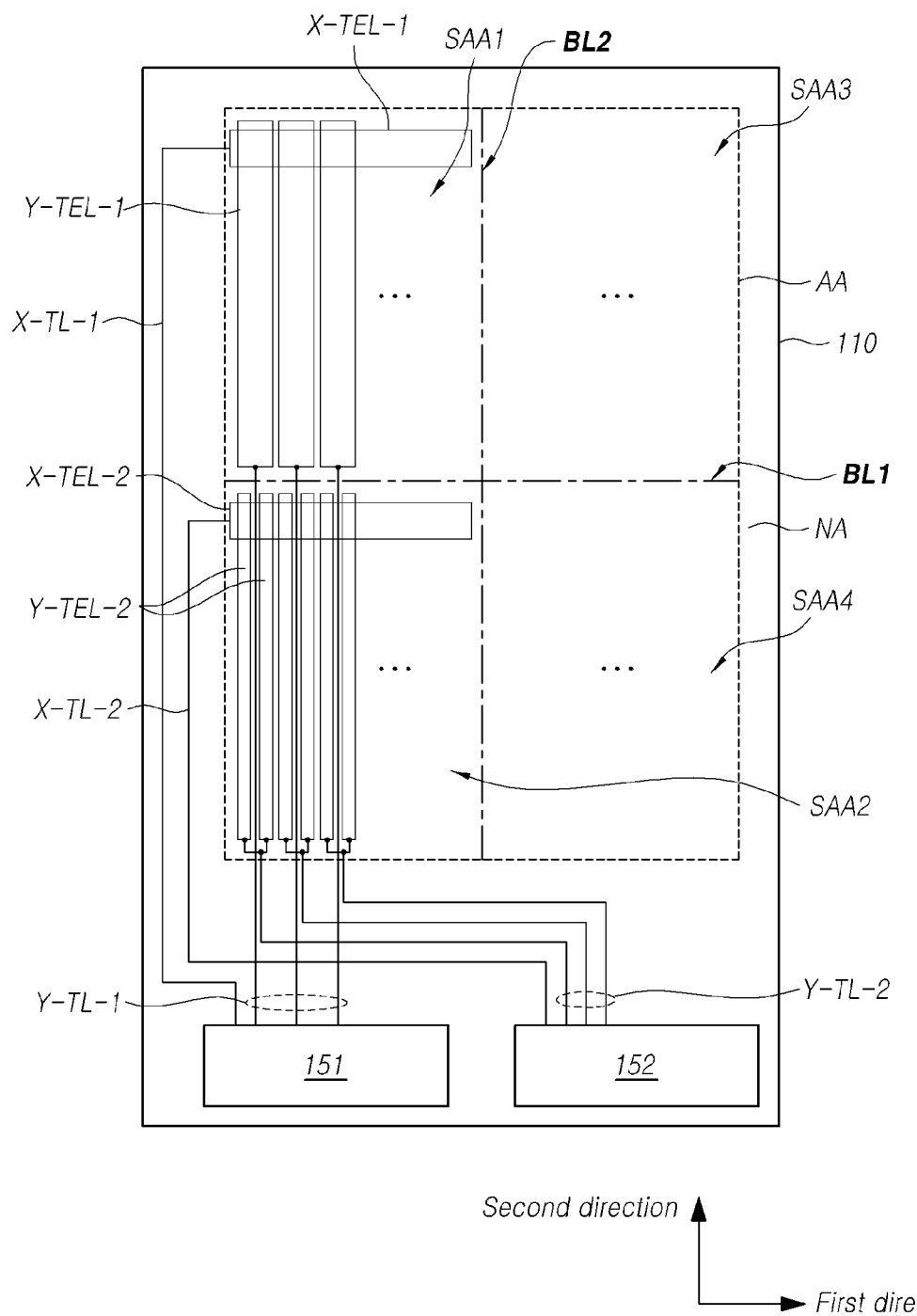
Figure 5:
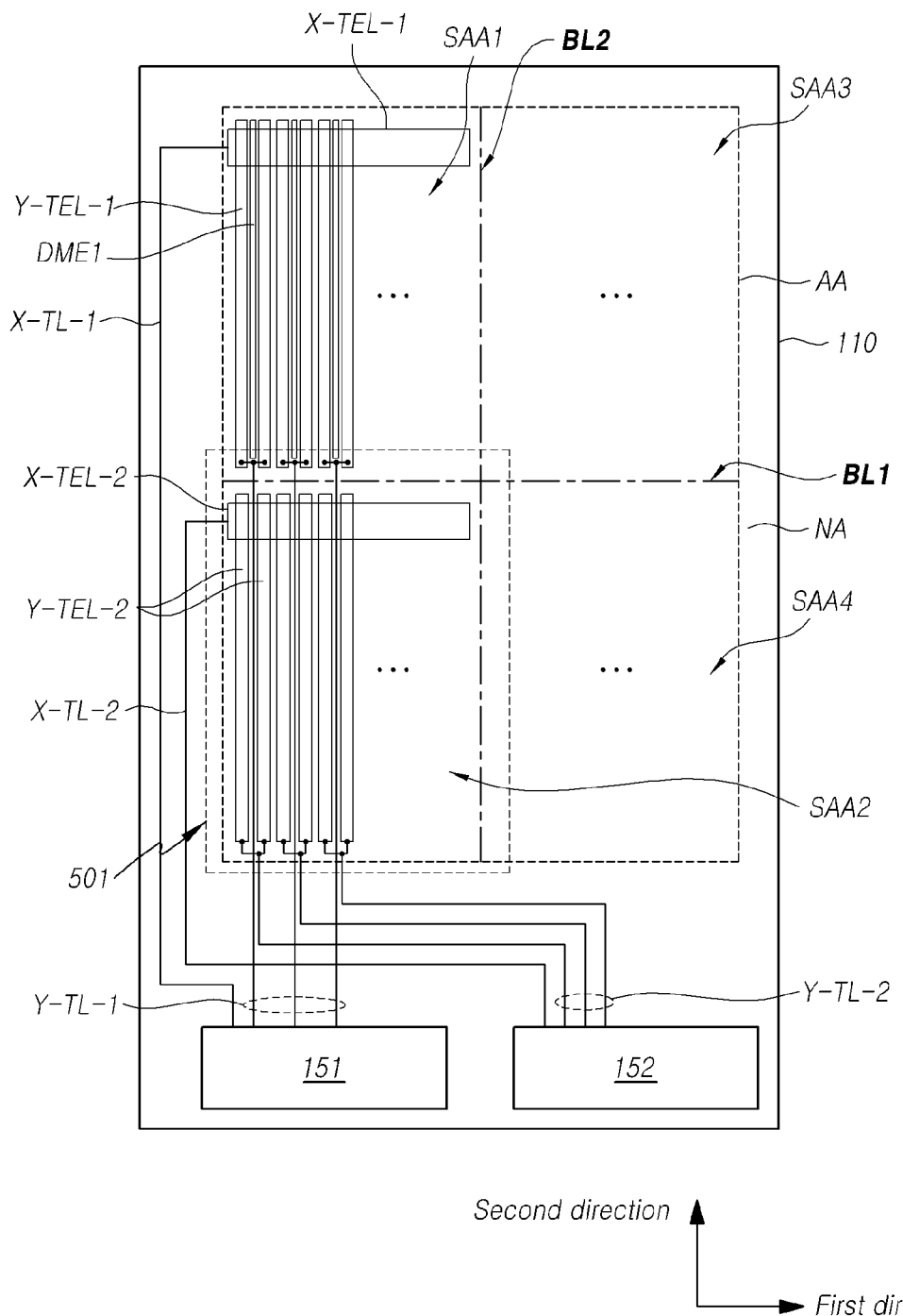

FIGS. 3 to 5 are diagrams illustrating examples of a touch sensor structure included in the touch display device 100 according to embodiments of the present disclosure.

Referring to FIG. 3, the touch display device 100 can include a plurality of touch electrode lines TEL and a plurality of touch routing lines TL disposed in the display panel 110. The touch display device 100 can include a touch driving circuit 150 driving the plurality of touch electrode lines TEL and the plurality of touch routing lines TL.

Each of the plurality of touch electrode lines TEL can be electrically connected to the touch driving circuit 150 through the touch routing line TL. The touch driving circuit 150 can be disposed separately, in some cases, can be disposed to be integrated with a circuit for the display driving. For example, the touch driving circuit 150 can be disposed in a shape integrated with the data driving circuit 130.

Each of the plurality of touch electrode lines TEL can include a plurality of touch electrodes TE electrically connected to each other along one direction. Furthermore, each of the plurality of touch electrode lines TEL can include a plurality of touch electrode connecting patterns CL electrically connecting the plurality of touch electrodes TE each other.

For example, each of a plurality of X-touch electrode lines X-TEL can include a plurality of X-touch electrodes X-TE arranged in a first direction and a plurality of X-touch electrode connecting patterns X-CL electrically connecting the plurality of X-touch electrodes X-TE each other.

Each of a plurality of Y-touch electrode lines Y-TEL can include a plurality of Y-touch electrodes Y-TE arranged in a second direction crossing the first direction and a plurality of Y-touch electrode connecting patterns Y-CL electrically connecting the plurality of Y-touch electrodes Y-TE each other.

The X-touch electrode line X-TEL and the Y-touch electrode line Y-TEL can be disposed on different layers from each other. Alternatively, the X-touch electrode X-TE and the Y-touch electrode Y-TE can be disposed on a same layer. In this case, one of the X-touch electrode connecting pattern X-CL and the Y-touch electrode connecting pattern Y-CL can be disposed on a different layer from the touch electrode TE.

The touch electrode TE, for example, can be a tetragonal shape, but not limited to this.

The touch electrode TE can be made of a transparent conductive material, and can be disposed without interrupting an image display function of the display panel 110.

Alternatively, the touch electrode TE can be made of an opaque metal. In this case, the touch electrode TE can a shape that an area corresponding to a light-emitting area of the light-emitting element ED disposed in the display panel 110 is opened. For example, the touch electrode TE is implemented as a mesh type and disposed to avoid the light-emitting area.

In a structure that the plurality of X-touch electrode lines X-TEL and the plurality of Y-touch electrode lines Y-TEL are disposed to cross each other, the touch driving circuit 150 can drive the touch electrode line TEL through the touch routing line TL and perform the touch sensing.

For example, one of the X-touch electrode line X-TEL and the Y-touch electrode line Y-TEL can be a touch driving electrode which a touch driving signal is applied. The other one of the X-touch electrode line X-TEL and the Y-touch electrode line Y-TEL can be a touch sensing electrode which a touch sensing signal is detected.

The touch driving circuit 150 can detect a change of a mutual-capacitance generated when a user touches in a state that different signals are applied to the X-touch electrode line X-TEL and the Y-touch electrode line Y-TEL.

The touch driving circuit 150 can transmit a sensing data according to the change of the mutual-capacitance detected to a touch controller. The touch controller can detect whether a touch is occurred or not and a touch coordinate on the display panel 110 based on the sensing data received from the touch driving circuit 150.

The touch electrode line TEL disposed in the display panel 110 can be disposed to be divided on a plurality of areas in the active area AA.

As the touch electrode line TEL is disposed to be divided on each area, a load of the touch electrode line TEL can be reduced. In the case that an area of the display panel 110 increases, the load of the touch electrode line TEL can be reduced and a performance of the touch sensing can be improved.

Referring to FIG. 4, the active area AA of the display panel 110 can include a plurality of sub-areas SAA divided by a boundary along the first direction and a boundary along the second direction.

The active area AA can include at least two or more sub-areas SAA divided by a first boundary BL1 along the first direction. The active area AA can include at least two or more sub-areas SAA divided by a second boundary BL2 along the second direction.

For example, a first sub-area SAA1 and a second sub-area SAA2 can be divided (e.g., separated) by the first boundary BL1. A third sub-area SAA3 and the fourth sub-area SAA can be divided (e.g., separated) by the first boundary BL1.

The first sub-area SAA1 and the third sub-area SAA3 can be divided (e.g., separated) by the second boundary BL2. The second sub-area SAA2 and the fourth sub-area SAA4 can be divided (e.g., separated) by the second boundary BL2.

FIG. 4 illustrates an example that the active area AA is divided as four sub-areas SAA, but the active area AA can be divided into a plurality of sub-areas SAA by the first boundary BL1 and the second boundary BL2.

The touch electrode line TEL disposed on each of the plurality of sub-areas SAA can be disposed to be separated from the touch electrode line TEL disposed on a different sub-area SAA.

The touch electrode line TEL disposed on each of the plurality of sub-areas SAA can be driven independently from each other.

For example, a first X-touch electrode line X-TEL-1 disposed on the first sub-area SAA1 can be electrically connected to a first touch driving circuit 151 through a first X-touch routing line X-TL-1. A first Y-touch electrode line Y-TEL-1 can be electrically connected to the first touch driving circuit 151 through a first Y-touch routing line Y-TL-1.

A second X-touch electrode line X-TEL-2 disposed on the second sub-area SAA2 can be electrically connected to a second touch driving circuit 152 through a second X-touch routing line X-TL-2. A second Y-touch electrode line Y-TEL-2 can be electrically connected to the second touch driving circuit 152 through a second Y-touch routing line Y-TL-2.

The first X-touch electrode line X-TEL-1 and the first Y-touch electrode line Y-TEL-1 can be driven by the first touch driving circuit 151. The second X-touch electrode line X-TEL-2 and the second Y-touch electrode line Y-TEL-2 can be driven by the second touch driving circuit 152. The touch electrode line TEL of the third sub-area SAA3 and the fourth sub-area SAA4 can be disposed as a structure similar to the touch electrode line TEL disposed on the first sub-area SAA1 and the second sub-area SAA2, and can be driven as a similar manner.

The touch electrode line TEL disposed on the first sub-area SAA1 and the touch electrode line TEL disposed on the second sub-area SAA2 are electrically divided and driven by different touch driving circuits 151 and 152, the load for the touch sensing can be reduced and the performance of the touch sensing can be improved.

Furthermore, in some cases, the touch electrode lines TEL disposed on two or more sub-areas SAA can be driven by a same touch driving circuit 150. For example, the touch electrode line TEL disposed on the first sub-area SAA1 and the touch electrode line TEL disposed on the second sub-area SAA2 can be driven by the same touch driving circuit 150. The touch electrode line TEL disposed on the third sub-area SAA3 and the touch electrode line TEL disposed on the fourth sub-area SAA4 can be driven by the same touch driving circuit 150 that is different from the touch driving circuit that drives the touch electrode lines TEL in the first sub-area SAA1 and the second sub-area SAA2. Alternatively, for another example, the touch electrode line TEL disposed on the first sub-area SAA1, the second sub-area SAA2, the third sub-area SAA3 and the fourth sub-area SAA4 can be driven by the same touch driving circuit 150. In this case, as the touch electrode line TEL disposed on each sub-area SAA is disposed as a separated structure, the load of the touch electrode line TEL can be reduced and the performance of the touch sensing can be improved.

Such as described above, in a structure that the touch electrode line TEL is disposed separately on each of the plurality of sub-areas SAA, some of the touch routing lines TL can be disposed on the active area AA.

For example, the first X-touch routing line X-TL-1 electrically connected to the first X-touch electrode line X-TEL-1 of the first sub-area SAA1 and the second X-touch routing line X-TL-2 electrically connected to the second X-touch electrode line X-TEL-2 of the second sub-area SAA2 can be disposed on the non-active area NA.

The second Y-touch routing line Y-TL-2 electrically connected to the second Y-touch electrode line Y-TEL-2 of the second sub-area SAA2 can be disposed on the non-active area NA.

In contrast, a part of the first Y-touch routing line Y-TL-1 electrically connected to the first Y-touch electrode line Y-TEL-1 of the first sub-area SAA1 can be disposed on the active area AA and another part of the first Y-touch routing line Y-TL-1 is disposed in the non-active area NA.

The part of the first Y-touch routing line Y-TL-1 that is disposed in the active area AA can also be disposed on the second sub-area SAA2. The first Y-touch routing line Y-TL-1 can pass the second sub-area SAA2 and can be electrically connected to the first Y-touch electrode line Y-TEL-1 disposed on the first sub-area SAA1.

As the part of the first Y-touch routing line Y-TL-1 is disposed on the second sub-area SAA2, at least one of the second X-touch electrode line X-TEL-2 or the second Y-touch electrode line Y-TEL-2 disposed on the second sub-area SAA2 can be disposed to be separated on an area where the first Y-touch routing line Y-TL-1 is disposed. FIG. 4 illustrates an example that the second Y-touch electrode line Y-TEL-2 is disposed to be divided on the second sub-area SAA2 due to an arrangement of the first Y-touch routing line Y-TL-1. As shown in FIG. 4, each first Y-touch routing line Y-TL-1 is disposed between a pair of second Y-touch electrode lines Y-TEL2.

Such as described above, in the case that the touch electrode lines TEL are disposed to be divided on each sub-area SAA, the number of the touch routing line TL connected to the touch electrode line TEL can increase. As the number of the touch routing line TL increases, the non-active area NA can increase due to an arrangement of the touch routing line TL. But as the first Y-touch routing line Y-TL-1 is electrically connected to the first Y-touch electrode line Y-TEL-1 of the first sub-area SAA1 through the active area AA, it may not be required that a separate area is added for an arrangement of the first Y-touch routing line Y-TL-1 on the non-active area NA. Without increasing the non-active area NA due to an addition of the first Y-touch routing line Y-TL-1, the touch sensor structure divided as sub-area SAA can be implemented.

The touch sensor structure divided as the plurality of sub-areas SAA can be divided as an upper side touch sensor portion (e.g., a first portion) and a lower side touch sensor portion (e.g., a second portion) based on the first boundary BL1. Furthermore, the touch sensor structure can be divided as a left side touch sensor portion (e.g., a third portion) and a right side touch sensor portion (e.g., a fourth portion) based on the second boundary BL2. Here, the lower side touch sensor portion can be positioned closer to a pad that the touch routing line TL is connected to than the upper side touch sensor portion. That is, a distance between the lower touch sensor portion and an area where the pad that the touch routing line TL is connected is disposed can be less than a distance between the upper side touch sensor portion and the area where the pad is disposed.

Furthermore, as an area of the second Y-touch electrode line Y-TEL-2 is reduced (e.g., smaller) compared to an area of the first Y-touch routing line Y-TEL-1, a sensitivity difference of the touch sensing can be prevented or at least reduced by making an area of the first Y-touch electrode line Y-TEL-1 identical or similar to an area of the second Y-touch electrode line Y-TEL-2.

Referring to FIG. 5, at least one first dummy electrode DME1 separated from the first Y-touch electrode line Y-TEL-1 can be disposed on at least a part of an area of the first sub-area SAA1 corresponding to an area where the first Y-touch routing line Y-TL-1 is disposed on the second sub-area SAA2.

The first dummy electrode DME1 can be electrically separated from the first Y-touch electrode line Y-TEL-1.

A width of an area where the first dummy electrode DME1 is disposed can be identical or similar to a width of the first Y-touch routing line Y-TL-1. Alternatively, the width of the area where the first dummy electrode DME1 is disposed can be identical or similar to a width of an area where the second Y-touch electrode line Y-TEL-2 is not disposed on the second sub-area SAA2. Furthermore, a space between two parts of the first Y-touch electrode line Y-TEL-1 disposed on both sides of the first dummy electrode DME1 can be identical or similar to a space between two parts of the second Y-touch electrode line Y-TEL-2 disposed on both sides of the first Y-touch routing line Y-TL-1.

An area of the first Y-touch electrode line Y-TEL-1 disposed on the first sub-area SAA1 can be substantially identical to an area of the second Y-touch electrode line Y-TEL-2 disposed on the second sub-area SAA2.

Even the first Y-touch routing line Y-TL-1 is disposed to pass the first sub-area SAA1, it can be prevented that a difference between touch sensitivity by the first Y-touch electrode line Y-TEL-1 of the first sub-area SAA1 and touch sensitivity by the second Y-touch electrode line Y-TEL-2 of the second sub-area SAA2 is generated, or the difference can be reduced.

According to embodiments of the present disclosure, as the active area AA is divided as the plurality of sub-areas SAA, and the touch is sensed by disposing the touch electrode line TEL on each of the plurality of sub-areas SAA, thus the load of the touch electrode line TEL can be reduced and the performance of the touch sensing can be improved even an area of the active area AA increases.

Furthermore, by making an area of the touch electrode line TEL disposed on each sub-area SAA to be identical or similar to each other, thus it can be prevented that the difference of touch sensitivity by the touch electrode line TEL disposed on each sub-area SAA is generated.

Each of the plurality of touch electrode TE included in the touch electrode line TEL, such as an example above-mentioned, can be a tetragonal shape, but can have various structures for improving the performance of the touch sensing.

Figure 6:
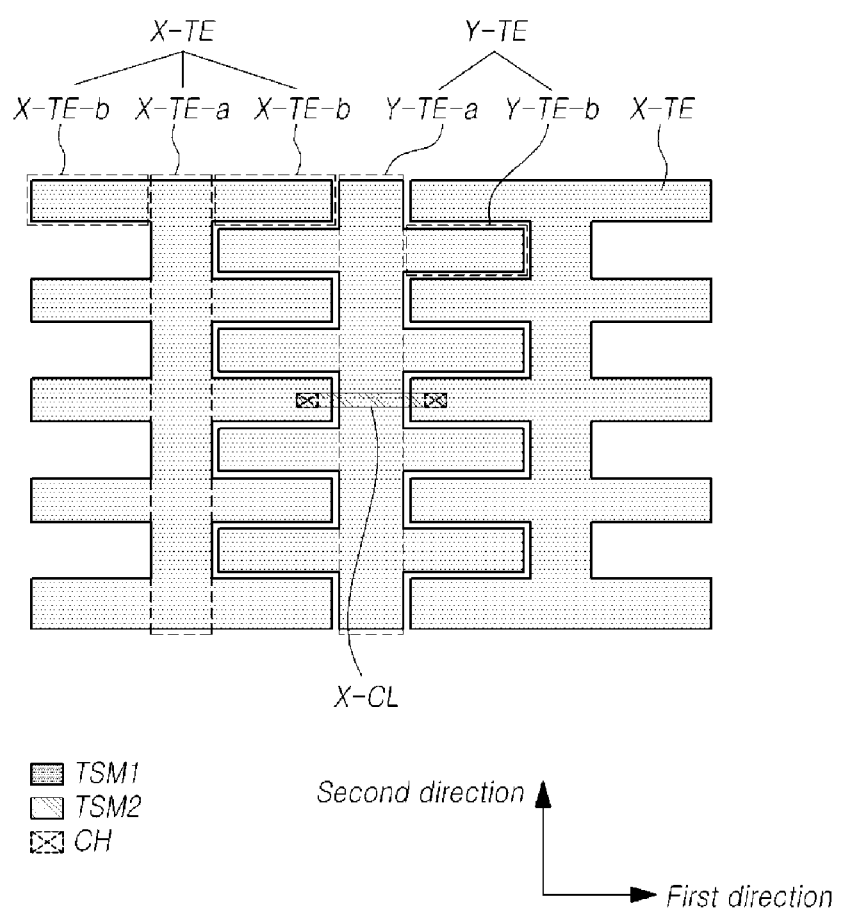
FIG. 6 is a diagram illustrating an example of a structure of a touch electrode included in a touch sensor structure of a touch display device according to an embodiment of the present disclosure.

FIG. 6 is a diagram illustrating an example of a structure of the touch electrode TE included in the touch sensor structure of the touch display device 100 according to an embodiment of the present disclosure.

Referring to FIG. 6, it illustrates examples of shapes of the X-touch electrode X-TE included in the X-touch electrode line X-TEL and the Y-touch electrode Y-TE included in the Y-touch electrode line Y-TEL. FIG. 6 is a diagram for describing an example of a structure of the touch electrode TE, it exemplary illustrates a case that the X-touch electrode line X-TEL and the Y-touch electrode line Y-TEL are crossing each other and the X-touch electrode X-TE and the Y-touch electrode Y-TE are disposed on a same layer.

The X-touch electrode X-TE can have a similar shape to the Y-touch electrode Y-TE.

Describing a shape of the touch electrode X-TE using the X-touch electrode X-TE as an example, the X-touch electrode X-TE can include at least a body portion X-TE-a and a plurality of wing portions X-TE-b.

The body portion X-TE-a of the X-touch electrode X-TE can be disposed in the first direction or the second direction, FIG. 6 illustrates an example that the body portion X-TE-a of the X-touch electrode X-TE is disposed in the second direction.

The wing portion X-TE-b of the X-touch electrode X-TE can be disposed in a direction crossing the body portion X-TE-a, FIG. 6 illustrates an example that the wing portion X-TE-b of the X-touch electrode X-TE is disposed in the first direction.

A width of the body portion X-TE-a of the X-touch electrode X-TE can be identical to a width of the wing portion X-TE-b of the X-touch electrode X-TE. Alternatively, the width of the body portion X-TE-a of the X-touch electrode X-TE can be greater than the width of the wing portion X-TE-b of the X-touch electrode X-TE.

The body portion X-TE-a of the X-touch electrode X-TE can be disposed to be alternated with a body portion Y-TE-a of the Y-touch electrode Y-TE in the first direction with a wing portion X-TE-b or a wing portion Y-TE-b disposed between the body portion X-TE-a and the body portion Y-TE-a.

The wing portion X-TE-b of the X-touch electrode X-TE can be disposed to be alternated with a wing portion Y-TE-b of the Y-touch electrode Y-TE in the second direction.

The wing portion X-TE-b of the X-touch electrode X-TE and the wing portion Y-TE-b of the Y-touch electrode Y-TE can be disposed to be interlocked each other. An area that an outer line of the X-touch electrode X-TE and an outer line of the Y-touch electrode Y-TE are faced to each other can increase. Furthermore, a length of a boundary between the X-touch electrode X-TE and the Y-touch electrode Y-TE can increase. The performance of the touch sensing based on the change of the mutual-capacitance between the X-touch electrode X-TE and the Y-touch electrode Y-TE can be improved.

The X-touch electrode X-TE and the Y-touch electrode Y-TE can be disposed by using an electrode disposed on a same layer. One of the X-touch electrode X-TE and the Y-touch electrode Y-TE can be connected by an electrode disposed on a same layer as the touch electrode TE, and the other can be connected by an electrode disposed on a different layer from the touch electrode TE.

For example, the Y-touch electrode Y-TE connected in the second direction can be connected by an electrode disposed on a same layer as the touch electrode TE.

The X-touch electrodes X-TE connected in the first direction can be electrically connected by the X-touch electrode connecting pattern X-CL disposed on a different layer from the X-touch electrodes X-TE.

For example, the X-touch electrode X-TE and the Y-touch electrode Y-TE can be disposed by using a first touch sensor metal TSM1. The X-touch electrode connecting pattern X-CL can be disposed by using a second touch sensor metal TSM2.

The second touch sensor metal TSM2 can be disposed on a different layer from the first touch sensor metal TSM1.

The X-touch electrode X-TE and the X-touch electrode connecting pattern X-CL can be electrically connected to each other through a contact hole CH.

Such as described above, the touch electrode line TEL can be implemented by using a layer where the first touch sensor metal TSM1 is disposed and a layer where the second touch sensor metal TSM2 is disposed.

By a structure that the touch electrode TE includes the body portion TE-a and the wing portion TE-b, a boundary between the X-touch electrode X-TE and the Y-touch electrode Y-TE can be increased and sensitivity of the touch sensing can be improved. Furthermore, by a structure of the touch electrode line TEL disposed separately on each sub-area SAA of the active area AA, the load can be reduced and the performance of the touch sensing can be improved.

Figure 7:
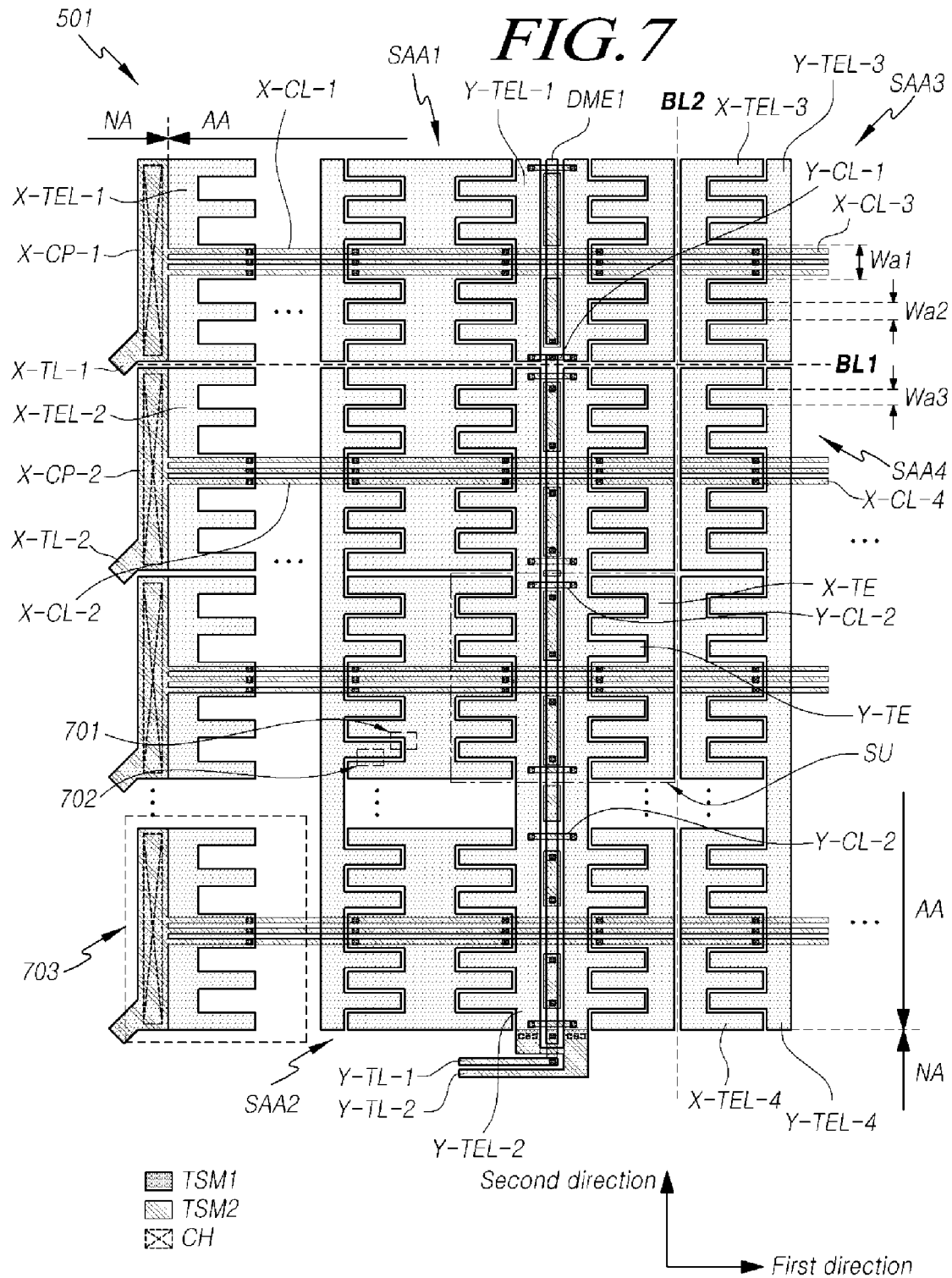
FIG. 7 is a diagram illustrating an example that the touch sensor structure illustrated in FIG. 5 is implemented by the structure of the touch electrode illustrated in FIG. 6 according to an embodiment of the present disclosure.

FIG. 7 is a diagram illustrating an example that the touch sensor structure illustrated in FIG. 5 is implemented by the structure of the touch electrode TE illustrated in FIG. 6 according to an embodiment. FIG. 7 exemplary illustrates a touch sensor structure implemented on an area indicated by 501 illustrated in FIG. 5.

Referring to FIGS. 6 and 7, the active area AA, for example, can be divided as four sub-areas SAA1, SAA2, SAA3, SAA4 by the first boundary BL1 and the second boundary BL2. The touch electrode line TEL disposed on each of four sub-areas SAA1, SAA2, SAA3, SAA4 can be disposed to be divided from each other.

The touch electrode line TEL disposed on each sub-area SAA can include the plurality of X-touch electrode lines X-TEL and the plurality of Y-touch electrode lines Y-TEL.

Each of the plurality of X-touch electrode lines X-TEL can include the plurality of X-touch electrodes X-TE. Each of the plurality of Y-touch electrode lines Y-TEL can include the plurality of Y-touch electrodes Y-TE. The X-touch electrode X-TE and the Y-touch electrode Y-TE can constitute one sensing unit SU.

The plurality of X-touch electrodes X-TE included in the X-touch electrode line X-TEL can be electrically connected by the X-touch electrode connecting pattern X-CL.

For example, the plurality of X-touch electrode X-TE can be made of the first touch sensor metal TSM1. The X-touch electrode connecting pattern X-CL can be made of the second touch sensor metal TSM2 disposed on a layer different from a layer where the first touch sensor metal TSM1 is disposed.

The X-touch electrode connecting pattern X-CL can be disposed in the first direction and can be electrically connected to the X-touch electrode X-TE through the contact hole CH. The plurality of X-touch electrode X-TE can be electrically connected in the first direction and can constitute the X-touch electrode line X-TEL. For example, the plurality of X-touch electrodes X-TE included in the first X-touch electrode line X-TEL-1 disposed on the first sub-area SAA1 can be electrically connected to each other by a first X-touch electrode connecting pattern X-CL-1. The plurality of X-touch electrodes X-TE included in the second X-touch electrode line X-TEL-2 disposed on the second sub-area SAA2 can be electrically connected to each other by a second X-touch electrode connecting pattern X-CL-2. The plurality of X-touch electrodes X-TE included in the third X-touch electrode line X-TEL-3 disposed on the third sub-area SAA3 can be electrically connected to each other by a third X-touch electrode connecting pattern X-CL-3. The plurality of X-touch electrodes X-TE included in the fourth X-touch electrode line X-TEL-4 disposed on the fourth sub-area SAA4 can be electrically connected to each other by a fourth X-touch electrode connecting pattern X-CL-4.

The X-touch electrode connecting pattern X-CL, for example, can be disposed on an area overlapping the wing portion X-TE-b of the X-touch electrode X-TE. The X-touch electrode connecting pattern X-CL may not be disposed on an area overlapping the wing portion Y-TE-b of the Y-touch electrode Y-TE. A part of the X-touch electrode connecting pattern X-CL can overlap the body portion Y-TE-a of the Y-touch electrode Y-TE.

A width Wa1 of the wing portion X-TE-b of the X-touch electrode X-TE positioned on an area overlapping the X-touch electrode connecting pattern X-CL can be greater than a width Wa2 of the wing portion X-TE-b of the X-touch electrode X-TE positioned on an area not overlapping the X-touch electrode connecting pattern X-CL.

The width Wa1 of the wing portion X-TE-b of the X-touch electrode positioned on an area overlapping the X-touch electrode connecting pattern X-CL can be greater than a width Wa3 of the wing portion Y-TE-b of the Y-touch electrode Y-TE.

As the X-touch electrode connecting pattern X-CL is disposed to overlap the wing portion X-TE-b having a large width among the wing portion X-TE-b of the X-touch electrode X-TE, a width of the X-touch electrode connecting pattern X-CL or the number of the X-touch electrode connecting pattern X-CL can increase. The X-touch electrode X-TE can be electrically connected while reducing a resistance of the X-touch electrode connecting pattern X-CL.

On an area where the X-touch electrode connecting pattern X-CL is not disposed, as a width of the wing portion X-TE-b of the X-touch electrode X-TE and a width of the wing portion Y-TE-b of the Y-touch electrode Y-TE are small relatively, a structure that a boundary between the X-touch electrode X-TE and the Y-touch electrode Y-TE increases can be maintained and the performance of the touch sensing can be improved.

The X-touch electrode line X-TEL can be electrically connected to an X-touch electrode contact pad X-CP on a boundary of the active area AA and the non-active area NA.

For example, the X-touch electrode X-TE made of the first touch sensor metal TSM1 can be disposed to be extended to the non-active area NA. The X-touch electrode contact pad X-CP made of the second touch sensor metal TSM2 can be disposed on an area overlapping the extended X-touch electrode X-TE. The extended X-touch electrode X-TE and the X-touch electrode contact pad X-CP can be electrically connected through the contact hole CH.

Alternatively, the extended portion of the X-touch electrode X-TE disposed on the non-active area NA and the X-touch electrode contact pad X-CP made of the second touch sensor metal TSM2 can be seen as the X-touch electrode contact pad X-CP integrally.

The X-touch electrode contact pad X-CP can be electrically connected to the X-touch routing line X-TL on the non-active area NA. The X-touch electrode line X-TEL can be electrically connected to the X-touch routing line X-TL through the X-touch electrode contact pad X-CP. For example, the first X-touch electrode line X-TEL-1 can be electrically connected to the first X-touch routing line X-TL-1 through a first X-touch electrode contact pad X-CP-1. The second X-touch electrode line X-TEL-2 can be electrically connected to the second X-touch routing line X-TL-2 through a second X-touch electrode contact pad X-CP-2. The X-touch routing line X-TL can be made of at least one of the first touch sensor metal TSM1 or the second touch sensor metal TSM2.

The plurality of Y-touch electrodes Y-TE included in the Y-touch electrode line Y-TEL can be directly connected to each other.

For example, the plurality of Y-touch electrodes Y-TE can be made of the first touch sensor metal TSM1. The plurality of Y-touch electrodes Y-TE can be connected in the second direction and can constitute the Y-touch electrode line Y-TEL.

The second Y-touch electrode line Y-TEL-2 disposed on the second sub-area SAA2 and a fourth Y-touch electrode line Y-TEL-4 disposed on the fourth sub-area SAA4 among the plurality of Y-touch electrode lines Y-TEL can be electrically connected to the Y-touch routing line Y-TL disposed on the non-active area NA on the boundary of the active area AA and the non-active area NA.

For example, the second Y-touch electrode line Y-TEL-2 can be electrically connected to the second Y-touch routing line Y-TL-2 on the boundary of the active area AA and the non-active area NA. The second Y-touch routing line Y-TL-2 can be made of at least one of the first touch sensor metal TSM1 or the second touch sensor metal TSM2.

The first Y-touch electrode line Y-TEL-1 disposed on the first sub-area SAA1 and a third Y-touch electrode line Y-TEL-3 disposed on the third sub-area SAA3 among the plurality of Y-touch electrode lines Y-TEL can be electrically connected to the Y-touch routing line Y-TL on the active area AA.

For example, the first Y-touch electrode line Y-TEL-1 can be electrically connected to the first Y-touch routing line Y-TL-1 on the active area AA.

The first Y-touch routing line Y-TL-1 can be disposed on the non-active area NA and the second sub-area SAA2. The first Y-touch routing line Y-TL-1 can pass the second sub-area SAA2 and can be electrically connected to the first Y-touch electrode line Y-TEL-1 disposed on the first sub-area SAA1.

The first Y-touch routing line Y-TL-1, for example, can be made of the first touch sensor metal TSM1. In some cases, the second touch sensor metal TSM2 can be disposed on an area overlapping the first Y-touch routing line Y-TL-1 and can be electrically connected to the first Y-touch routing line Y-TL-1 through the contact hole CH, and can reduce a resistance of the first Y-touch routing line Y-TL-1.

As the first Y-touch routing line Y-TL-1 is disposed on the second sub-area SAA2, the second Y-touch electrode line Y-TEL-2 disposed on the second sub-area SAA2 can be divided and disposed on both sides of the first Y-touch routing line Y-TL-1.

Two parts of the second Y-touch electrode line Y-TEL-2 can be electrically connected to each other by being connected to the second Y-touch routing line Y-TL-2 on the boundary of the active area AA and the non-active area NA.

Furthermore, the two parts of the second Y-touch electrode line Y-TEL-2 can be electrically connected to each other by a second Y-touch electrode connecting pattern Y-CL-2 disposed on the active area AA.

The second Y-touch electrode connecting pattern Y-CL-2, for example, can be made of the second touch sensor metal TSM2.

The two parts of the second Y-touch electrode line Y-TEL-2 can be electrically connected to each other by at least one second Y-touch electrode connecting pattern Y-CL-2. For example, the second Y-touch electrode connecting pattern Y-CL-2 can be disposed on an area adjacent to an upper boundary of the sensing unit SU and an area adjacent to a lower boundary of the sensing unit SU, and can be electrically connected to the second Y-touch electrode line Y-TEL-2.

As the two parts of the second Y-touch electrode line Y-TEL-2 disposed to be separated from each other are connected on a plurality of points by the second Y-touch electrode connecting pattern Y-CL-2, it can be prevented that the load increases by a structure that the second Y-touch electrode line Y-TEL-2 is divided.

The first Y-touch routing line Y-TL-1 can pass the second sub-area SAA2 and can be electrically connected to the first Y-touch electrode line Y-TEL-1 on the first sub-area SAA1.

As the first Y-touch routing line Y-TL-1 passes the second sub-area SAA2 and is extended to the first sub-area SAA1, a portion of the first Y-touch routing line Y-TL-1 can be disposed on the first boundary BL1.

A point that the first Y-touch routing line Y-TL-1 is connected to the first Y-touch electrode line Y-TEL-1 can be positioned inside of the first sub-area SAA1. The point that the first Y-touch routing line Y-TL-1 is connected to the first Y-touch electrode line Y-TEL-1 may not be positioned on the boundary of the first sub-area SAA1 and the second sub-area SAA2.

As the first Y-touch routing line Y-TL-1 passes the second sub-area SAA2 and is electrically connected to the first Y-touch electrode line Y-TEL-1 disposed on the first sub-area SAA1, in a structure that the touch electrode line TEL is divided and disposed on the plurality of sub-areas SAA, the touch routing line TL can be disposed without increasing the non-active area NA.

Since an area of the second Y-touch electrode line Y-TEL-2 decreases according to that the first Y-touch routing line Y-TL-1 is disposed on the second sub-area SAA2, an area of the first Y-touch electrode line Y-TEL-1 positioned on an area corresponding to the second Y-touch electrode line Y-TEL-2 can be identical or similar to an area of the second Y-touch electrode line Y-TEL-2.

For example, the first Y-touch electrode line Y-TEL-1 can be disposed to be divided as two parts similar to the second Y-touch electrode line Y-TEL-2.

The two parts of the first Y-touch electrode line Y-TEL-1 can be electrically connected to each other by a first Y-touch electrode connecting pattern Y-CL-1. A load increase due to a structure that the first Y-touch electrode line Y-TEL-1 is divided can be prevented by the first Y-touch electrode connecting pattern Y-CL-1.

At least one first dummy electrode DME1 can be disposed between the two parts of the first Y-touch electrode line Y-TEL-1.

The first dummy electrode DME1 can be disposed to be electrically separated from the first Y-touch electrode line Y-TEL-1 and the first Y-touch routing line Y-TL-1.

A boundary of the first dummy electrode DME1 and the first Y-touch routing line Y-TL-1 can be different from the boundary of the first sub-area SAA1 and the second sub-area SAA2. The boundary of the first dummy electrode DME1 and the first Y-touch routing line Y-TL-1 can be positioned inside of the first sub-area SAA1.

The first dummy electrode DME1 can be disposed on the first sub-area SAA1 to be corresponded to a portion of the first Y-touch routing line Y-TL-1 disposed on the second sub-area SAA2. A width of the first dummy electrode DME1 can be identical or similar to a width of the first Y-touch routing line Y-TL-1.

An area of the first Y-touch electrode line Y-TEL-1 disposed on the first sub-area SAA1 can be reduced to be corresponding to that an area of the second Y-touch electrode line Y-TEL-2 is reduced due to an arrangement of the first Y-touch routing line Y-TL-1 on the second sub-area SAA2. An electrode positioned on an area remained according to decreasing an area of the first Y-touch electrode line Y-TEL-1 can become the first dummy electrode DME1.

While maintaining touch sensitivity by the touch electrode line TEL disposed on the first sub-area SAA1 and touch sensitivity by the touch electrode line TEL disposed on the second sub-area SAA2 to be identical or similar to each other, a structure that some of the touch routing lines TL is disposed on the active area AA can be implemented.

As the Y-touch routing line Y-TL is disposed in the second direction, a portion of the Y-touch routing line Y-TL can be positioned on the first boundary BL1.

As the second boundary BL2 which is a boundary of the second direction divides the first sub-area SAA1 and the third sub-area SAA3, the second sub-area SAA2 and the fourth sub-area SAA4, the Y-touch routing line Y-TL disposed in the second direction may not be disposed on the second boundary BL2.

The first Y-touch routing line Y-TL-1 can be extended from the boundary of the active area AA and the non-active area NA to the non-active area NA and can cross the second Y-touch routing line Y-TL-2. On an area where the first Y-touch routing line Y-TL-1 and the second Y-touch routing line Y-TL-2 are crossing each other, both can be disposed on different layers.

Such as described above, according to embodiments of the present disclosure, the touch sensor structure being capable of reducing the load by the touch electrode line TEL can be provided by a structure that the touch electrode line TEL is divided and disposed on the plurality of sub-areas SAA. Furthermore, as a portion of the touch routing line TL is disposed on the active area AA, a structure being capable of improving the performance of the touch sensing can be provided without the non-active area NA due to an arrangement of the touch routing line TL.

The touch electrode TE constituting the touch electrode line TEL, such as an example above-mentioned, can be made of the transparent conductive material, or can be made of the opaque metal material. In the case that the touch electrode TE is the opaque metal material, the touch electrode TE can have a shape that an area corresponding to the light-emitting area of the subpixel SP is opened for not dropping the image display performance of the display panel 110. The shape of the touch electrode TE including the opened portion can be various according to types of the subpixel SP.

Figure 8:
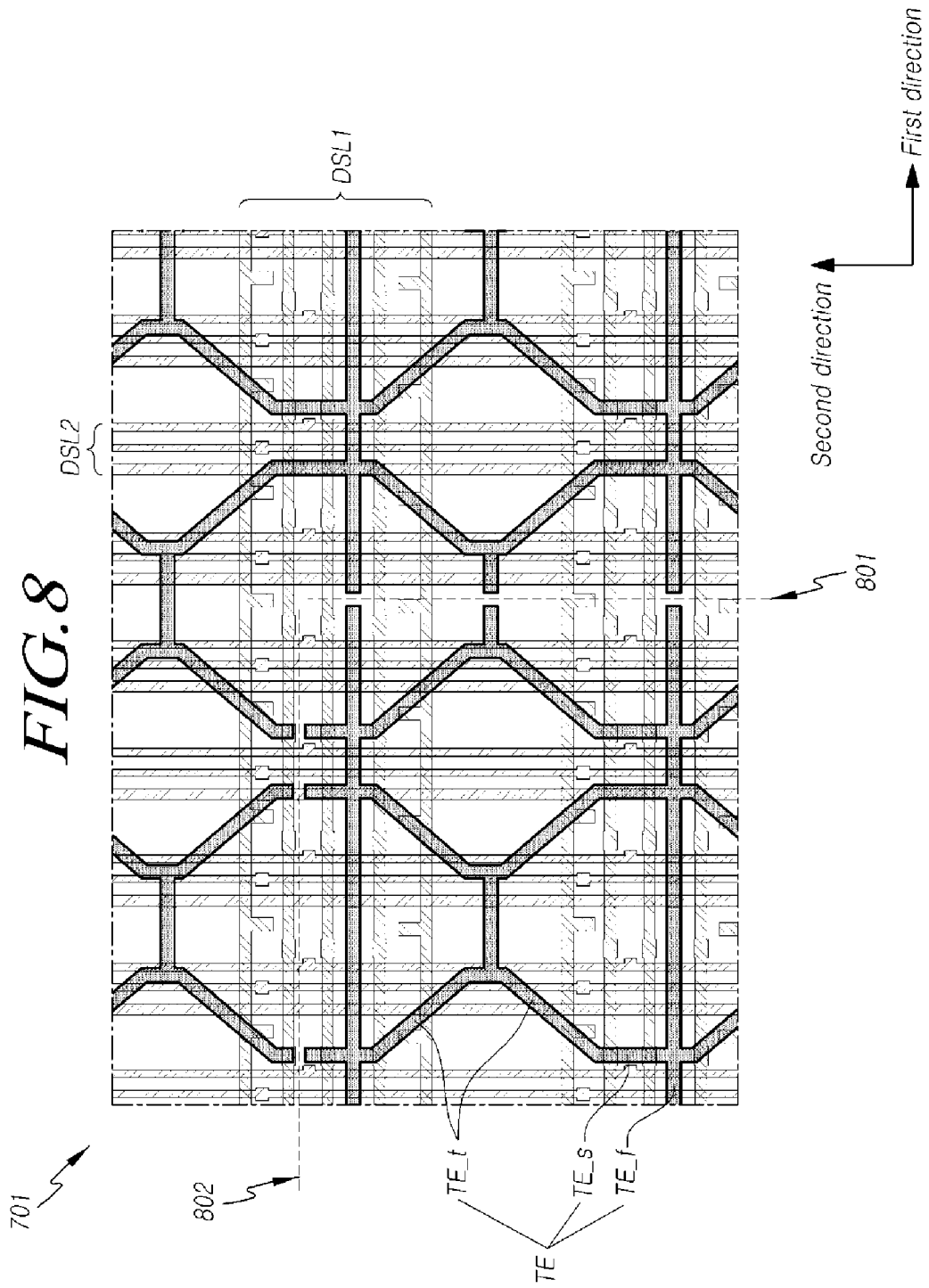
FIG. 8 is a diagram illustrating an example of a structure of an electrode constituting a touch sensor structure of a touch display device according to an embodiment of the present disclosure.

FIG. 8 is a diagram illustrating an example of a structure of an electrode constituting a touch sensor structure of the touch display device 100 according to embodiments of the present disclosure. FIG. 8 exemplary illustrates a structure of an electrode constituting a touch sensor structure on an area indicated by 701 illustrated in FIG. 7.

FIG. 8 illustrates an example of a specific structure of an electrode constituting the body portion TE-a and the wing portion TE-b of the touch electrode TE above-mentioned. The electrode illustrated in FIG. 8 is cut in a certain direction, can form the body portion TEa and the wing portion TE-b of the touch electrode TE. Furthermore, a structure of the touch routing line TL electrically connected to the touch electrode TE can be identical to a structure of the electrode illustrated in FIG. 8.

Referring to FIG. 8, it exemplary illustrates a structure that a display signal line DSL supplying a signal for the display driving is disposed on the display panel 110 and the touch electrode TE is disposed.

The display signal line DSL can be include a plurality of first display signal lines DSL1 disposed in the first direction and a plurality of second display signal lines DSL2 disposed in the second direction.

The first display signal line DSL1, for example, can be the gate line GL or the light-emitting control line EML. The second display signal line DSL2, for example, can be a data line DL or a line supplying at least one of the first driving voltage VDD, the reference voltage Vref or the second driving voltage VSS.

The touch electrode TE, for example, can included a first portion TE_f disposed in the first direction, a second portion TE_s disposed in the second direction and a third portion TE_t disposed in a third direction different from the first direction and the second direction.

The electrode constituting the touch electrode TE can be cut in the first direction such as a portion indicated by 801 or can be cut in the second direction such as a portion indicated by 802 for constituting the X-touch electrode TE or the Y-touch electrode Y-TE.

The electrode including the first portion TE_f, the second portion TE_s and the third portion TE_t can be cut in the first direction or the second direction, and can constitute the body portion TE-a or the wing portion TE-b of the touch electrode TE above-mentioned.

The touch routing line TL can include at least some of the first portion TE_f, the second portion TE_s or the third portion TE_t similarly o the touch electrode TE, and can be cut in the first direction or the second direction.

As the touch electrode TE is formed to include the first portion TE_f, the second portion TE_s and the third portion TE_t disposed in different directions one another, the touch electrode TE can include a plurality of opened portions. The shape of the opened portion of the touch electrode TE can be various, and can be determined depending on a shape of the light-emitting area of the subpixel SP disposed on the display panel 110.

Figure 9:
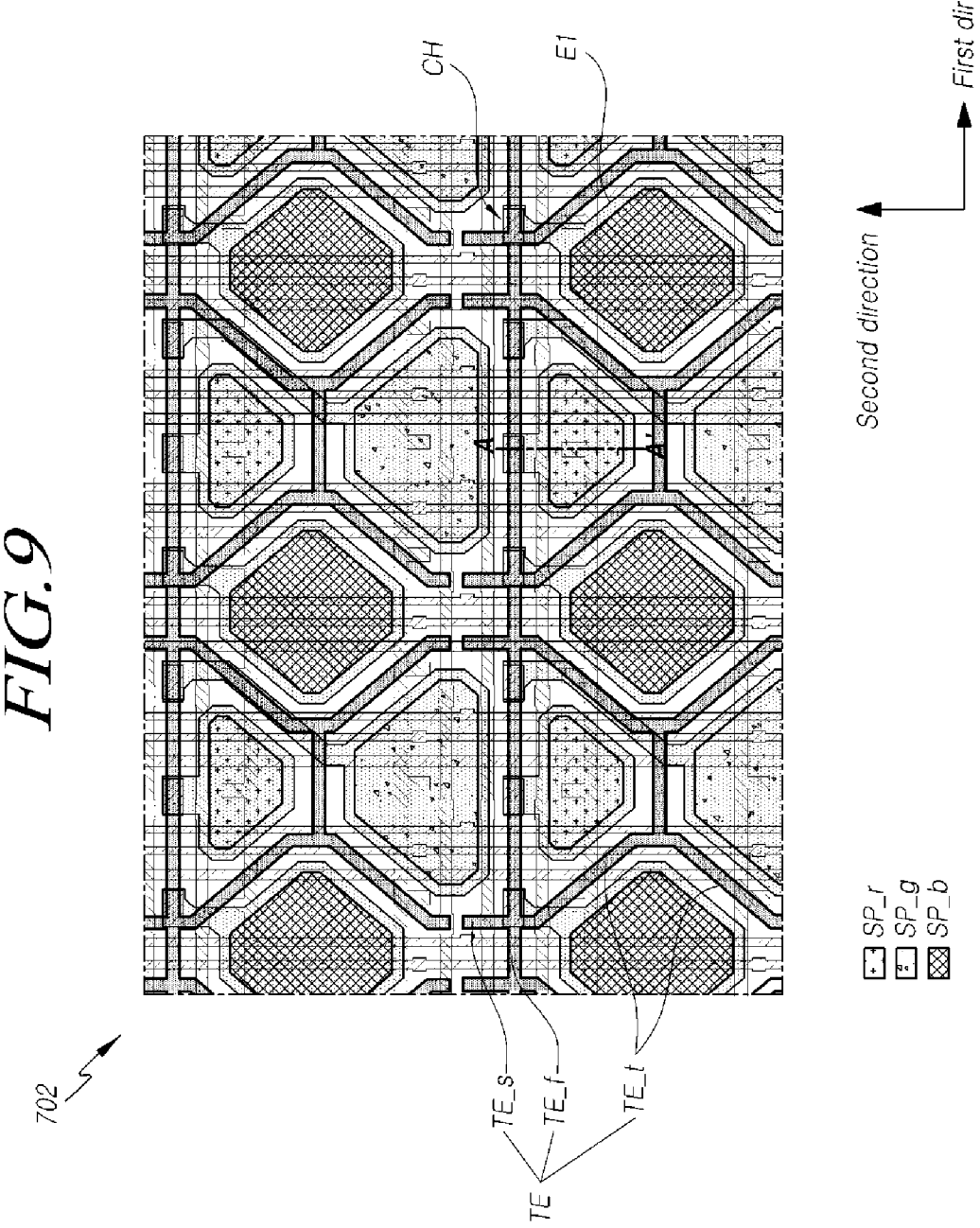
FIG. 9 is a diagram illustrating an example of an arrangement relationship of an electrode constituting a touch sensor structure and a configuration included in a subpixel in a touch display device according to an embodiment of the present disclosure.
Figure 10:
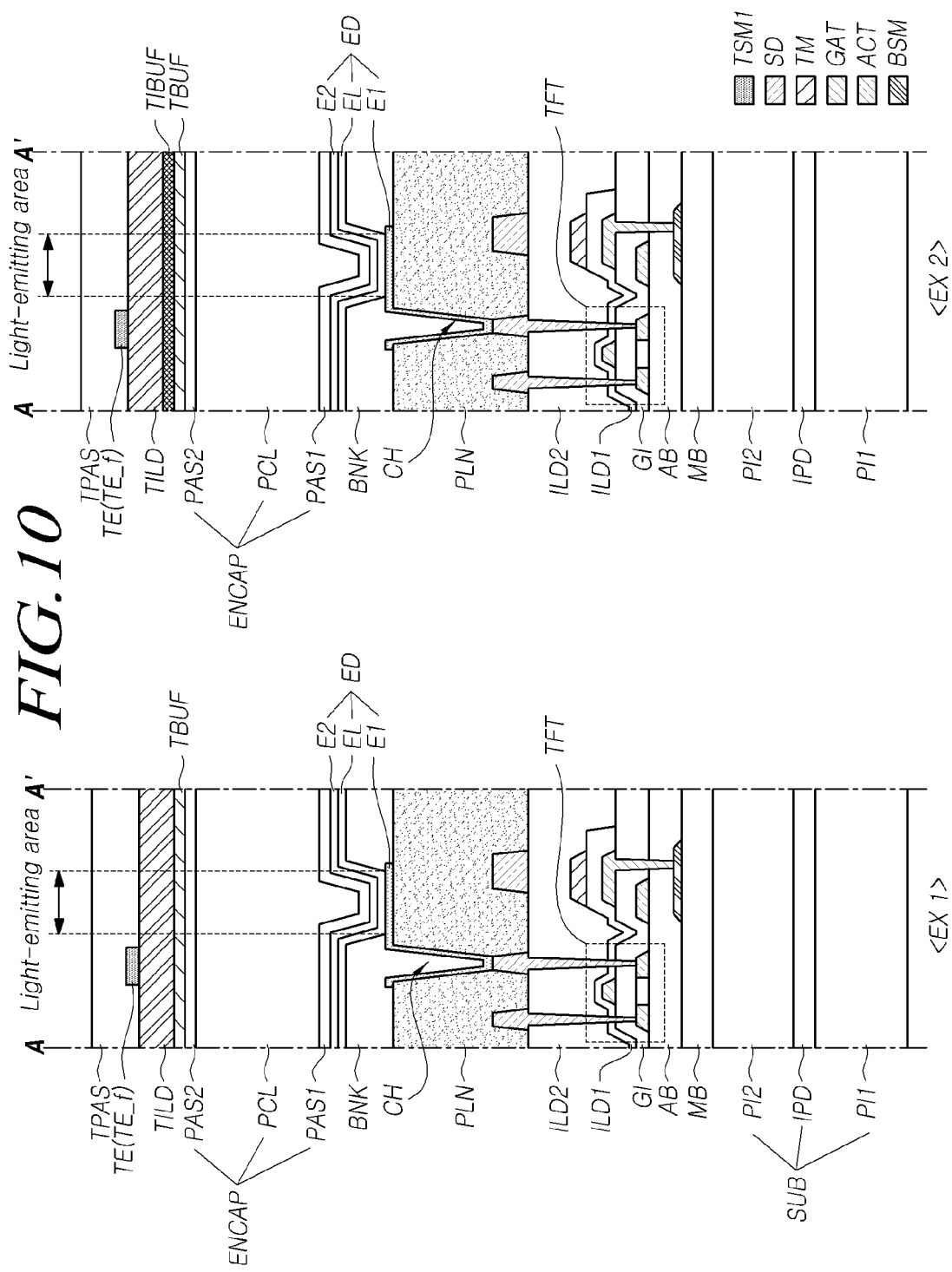
FIG. 10 is a diagram illustrating an example of a cross-sectional structure of A-A′ portion illustrated in FIG. 9 according to an embodiment of the present disclosure.

FIG. 9 is a diagram illustrating an example of an arrangement relationship of an electrode constituting a touch sensor structure and a configuration included in the subpixel SP in the touch display device 100 according to embodiments of the present disclosure. FIG. 9 exemplary illustrates a structure of an electrode constituting a touch sensor structure on an area indicated by 702 illustrated in FIG. 7 according to one embodiment. FIG. 10 is a diagram illustrating an example of a cross-sectional structure of A-A' portion illustrated in FIG. 9 according to one embodiment.

Referring to FIGS. 9 and 10, the light-emitting area of the light-emitting element ED disposed on the subpixel SP can be positioned on an area overlapping the opened portion of the touch electrode TE.

The light-emitting area of the light-emitting element ED can mean an area where the light-emitting layer EL and the second electrode E2 are disposed to overlap on the first electrode E1 of the light-emitting element ED. Furthermore, the light-emitting area of the light-emitting element ED can mean an area where a bank BNK is not disposed among an area where the first electrode E1 of the light-emitting element ED is disposed.

FIG. 9 illustrates an example of a shape that the light-emitting areas of a red subpixel SP_r, a green subpixel SP_g and a blue subpixel SP_b are disposed, a shape and a size of the subpixel SP constituting one pixel can be various depending on the display panel 110.

The first portion TE_f, the second portion TE_s and the third portion TE_t of the touch electrode TE can be disposed to avoid the light-emitting area of the subpixel SP.

The touch electrode TE can be disposed between the light-emitting areas of adjacent subpixels SP and can prevent or reduce that the touch electrode TE affects the image displaying according to a viewing angle.

As the touch electrode TE is disposed to avoid the light-emitting area of the subpixel SP, thus the touch electrode TE can be disposed to overlap a certain structure positioned on the subpixel SP.

For example, the first portion TE_f of the touch electrode TE disposed in the first direction can be disposed to overlap at least a portion of the contact hole CH for an electrical connection between the first electrode E1 of the light-emitting element ED and a thin film transistor TFT on the subpixel SP.

Referring to FIG. 9 and <EX 1> of FIG. 10, a multi buffer layer MB can be disposed on a substrate SUB. The substrate SUB, for example, can include a first polyimide layer PI1, an interlayer polyimide layer IPD and a second polyimide layer PI2. The multi buffer layer MB can be a structure that a plurality of insulating layers are laminated.

A light shield metal layer BSM can be disposed on the multi buffer layer MB. The light shield metal layer BSM can constitute the display signal line DSL, or can constitute a portion of the storage capacitor Cstg disposed on the subpixel SP.

An active buffer layer AB can be disposed on the light shield metal layer BSM.

An active layer ACT can be disposed on the active buffer layer AB. The active layer ACT can be made of a semiconductor material.

The active layer ACT can constitute a channel of the thin film transistor TFT. Furthermore, the active layer ACT can constitute the display signal line DSL or the portion of the storage capacitor Cstg by being conductive.

A gate insulating layer GI can be disposed on the active layer ACT.

A gate metal layer GAT can be disposed on the gate insulating layer GI. The gate metal layer GAT can constitute a gate electrode of the thin film transistor TFT, or can constitute the display signal line DSL, or the like.

A first interlayer insulating layer ILD1 can be disposed on the gate metal layer GAT.

A display auxiliary electrode layer TM can be disposed on the first interlayer insulating layer ILD1. The display auxiliary electrode layer TM can be used variously for constituting the display signal line DSL or the portion of the storage capacitor Cstg or the like.

A second interlayer insulating layer ILD2 can be disposed on the display auxiliary electrode layer TM.

A source drain metal layer SD can be disposed on the second interlayer insulating layer ILD2. The source drain metal layer SD can constitute a source electrode and a drain electrode of the thin film transistor TFT, or can constitute the display signal line DSL or the like.

A planarization layer PLN can be disposed on the source drain metal layer SD.

The first electrode E1 of the light-emitting element ED can be disposed on the planarization layer PLN. The first electrode E1 of the light-emitting element ED can be electrically connected to the thin film transistor TFT positioned under the planarization layer PLN thorough the contact hole CH formed in the planarization layer PLN. The thin film transistor TFT electrically connected to the first electrode E1 of the light-emitting element ED, for example, can be the driving transistor DRT, or can be a transistor controlling the light-emitting timing of the light-emitting element ED such as an example of the FIG. 2.

The bank BNK can be disposed on the planarization layer PLN and the first electrode E1 of the light-emitting element ED. The bank BNK can be disposed to cover an edge portion of the first electrode E1 of the light-emitting element ED.

The light-emitting layer EL and the second electrode E2 of the light-emitting element ED can be disposed on a portion of the first electrode E1 exposed by the bank BNK and the bank BNK. The portion of the first electrode E1 exposed by the bank BNK can correspond to the light-emitting area.

An encapsulation layer ENCAP can be disposed on the second electrode E2 of the light-emitting element ED. The encapsulation layer ENCAP can include a plurality of layers. The encapsulation layer ENCAP can include at least one inorganic layer and at least one organic layer.

For example, the encapsulation layer ENCAP can include a first inorganic encapsulation layer PAS1, an organic encapsulation layer PCL and a second inorganic encapsulation layer PAS2.

The inorganic encapsulation layer PAS1, PAS2, for example, can be made of an inorganic insulating material such as silicon nitride SiNx, silicon oxide SiOx, silicon oxynitride SiON or aluminum oxide Al2O3, which can be deposited at a low temperature. The organic encapsulation layer PCL, for example, can be made of an organic insulating material such as an acrylic resin, an epoxy resin, polyimide, polyethylene or silicon oxycarbon SiOC.

The encapsulation layer ENCAP can seal the light-emitting element ED and can protect the light-emitting element ED from an external moisture and air.

The touch sensor structure for the touch sensing can be implemented on the encapsulation layer ENCAP.

For example, a touch buffer layer TBUF can be disposed on the encapsulation layer ENCAP. The touch buffer layer TBUF can be an inorganic layer. In some cases, the touch buffer layer TBUF may not be disposed, but the touch buffer layer TBUF can be disposed for making it easy to arrange the touch sensor metal TSM on the encapsulation layer ENCAP.

A touch insulating layer TILD can be disposed on the touch buffer layer TBUF.

Even though FIG. 10 does not illustrate the second touch sensor metal TSM2, the second touch sensor metal TSM2 constituting the touch electrode connecting pattern CL or the like can be disposed between the touch buffer layer TBUF and the touch insulating layer TILD.

The touch insulating layer TILD can be an inorganic layer. Alternatively, the touch insulating layer TILD can be an organic layer.

In the case that the touch insulating layer TILD is an organic layer, a thickness of the touch insulating layer TILD can be greater than a thickness of the touch buffer layer TBUF.

Furthermore, in the case that the touch insulating layer TILD is an organic layer, such as <EX 2> of FIG. 10, a touch insulating buffer layer TIBUF can be further disposed between the touch insulating layer TILD and the touch buffer layer TBUF. Such as described above, two or more buffer layer can be disposed between the encapsulation layer ENCAP and the touch insulating layer TILD.

The touch insulating buffer layer TIBUF can be disposed between the touch insulating layer TILD and the second touch sensor metal TSM2. The touch insulating buffer layer TIBUF can be an inorganic layer. The touch insulating buffer layer TIBUF can be made of a same material as the touch buffer layer TBUF.

At least a portion of the touch insulating layer TILD can be disposed to contact a top surface of the touch insulating buffer layer TIBUF.

As the touch insulating buffer layer TIBUF made of an inorganic layer is disposed between the touch insulating layer TILD and the second touch sensor metal TSM2, an adhesion of the touch insulating layer TILD which is an organic layer can become easier.

A thickness of the touch insulating buffer layer TIBUF can be smaller than a thickness of the touch insulating layer TILD, and can be similar to a thickness of the touch buffer layer TBUF.

The touch electrode TE can be disposed on the touch insulating layer TILD. The first touch sensor metal TSM1 can be disposed on the touch insulating layer TILD and can constitute the touch electrode TE. Furthermore, the first touch sensor metal TSM1 can be disposed on the touch insulating layer TILD and can constitute the touch routing line TL.

FIG. 10 exemplary illustrates a cross-sectional structure of a portion that the first portion TE_f of the touch electrode TE illustrated in FIG. 9 is disposed. The first portion TE_f of the touch electrode TE can be disposed on the touch insulating layer TILD.

The first portion TE_f of the touch electrode TE can be disposed to avoid the light-emitting area of the light-emitting element ED. Thus, the first portion TE_f of the touch electrode TE is non-overlapping with the light-emitting area. The first portion TE_f of the touch electrode TE can be disposed on an area overlapping at least a portion of the contact hole CH for an electrical connection between the first electrode E1 of the light-emitting element ED and the thin film transistor TFT.

The first portion TE_f of the touch electrode TE can be disposed between adjacent display signal lines DSL disposed in the first direction, or can be disposed to overlap a portion of the display signal line DSL.

As the touch electrode TE is positioned on an area overlapping the contact hole CH and is disposed to avoid the light-emitting area of the light-emitting element ED, the touch sensor structure can be implemented without dropping the image display function of the display panel 110.

A touch protective layer TPAS can be disposed on the touch electrode TE made of the first touch sensor metal TSM1 and can protect the touch electrode TE.

Such as described above, as each portion of an electrode constituting the touch electrode TE or the touch routing line TL is disposed on an area not overlapping the light-emitting area of the light-emitting element ED disposed on the sub-pixel SP and is disposed on a position reducing an interruption of a viewing angle of the light-emitting area, thus the touch sensor structure can be implemented while preventing or reducing reduction of image display performance of the display panel 110.

Below, a specific example that the touch sensor structure illustrated in FIG. 5 is implemented by the touch electrode TE and the touch routing line TL having an electrode structure above-mentioned will be described. Furthermore, such as described above, the touch electrode TE can have various shapes other than an electrode structure above-mentioned, and embodiments of the present disclosure can be applied to various electrode structures.

FIGS. 11 to 15 are diagrams illustrating specific examples that a touch sensor structure of the touch display device 100 is implemented on the active area AA of the display panel 110 according to embodiments of the present disclosure.

Figure 11:
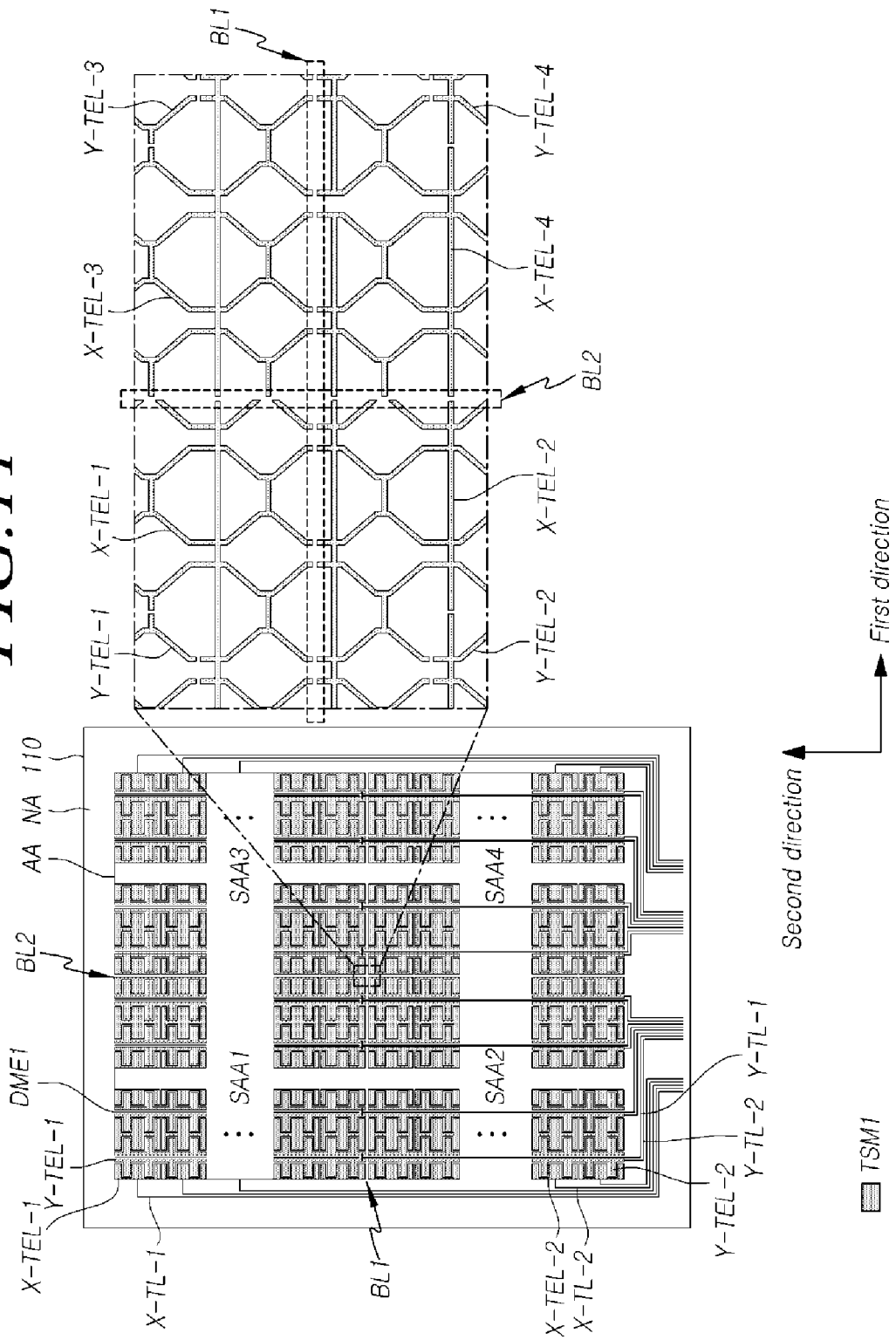
FIGS. 11 to 15 are diagrams illustrating specific examples that a touch sensor structure of a touch display device is implemented on an active area of a display panel according to embodiments of the present disclosure.
Figure 12:
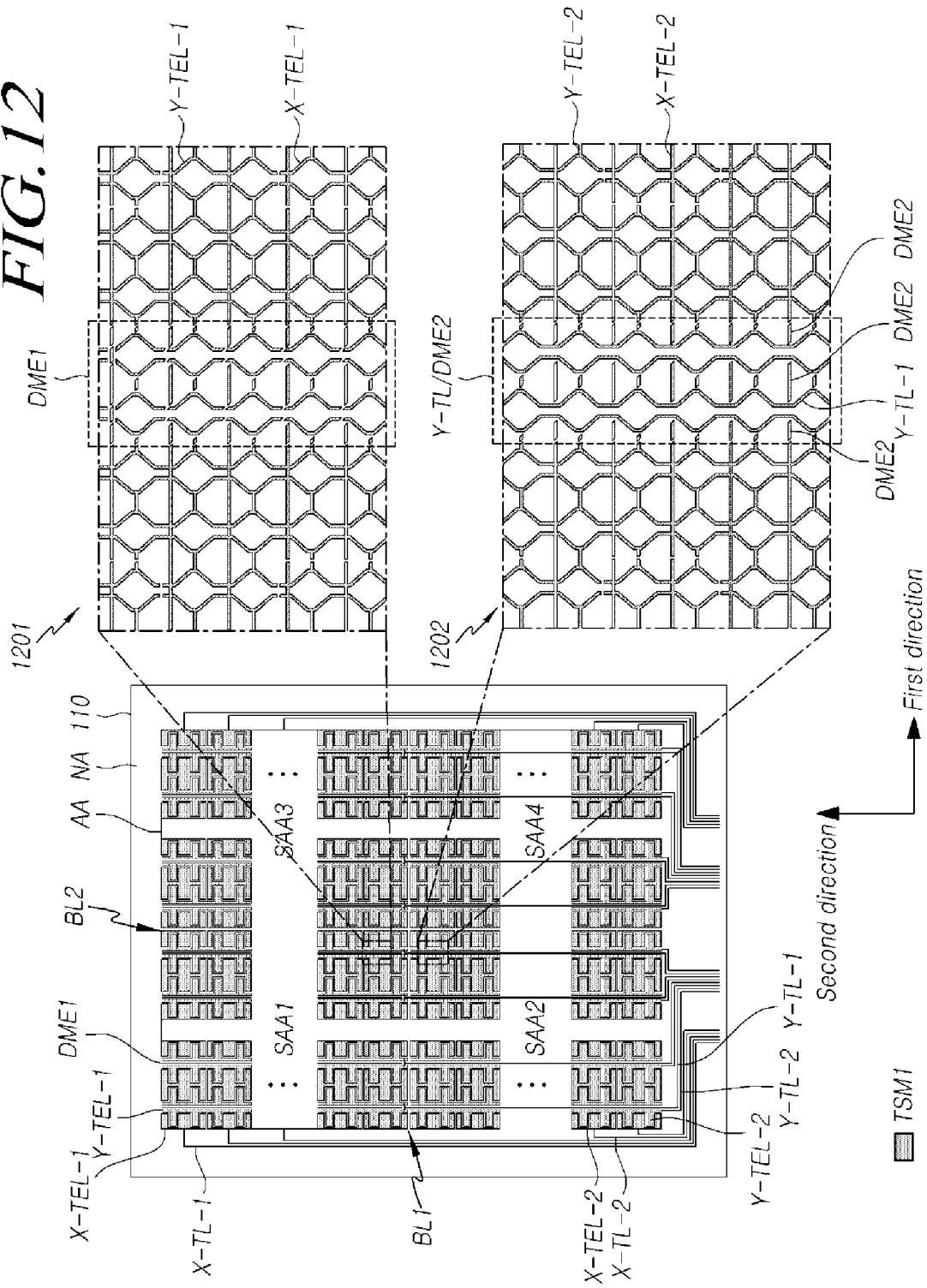
Figure 13:
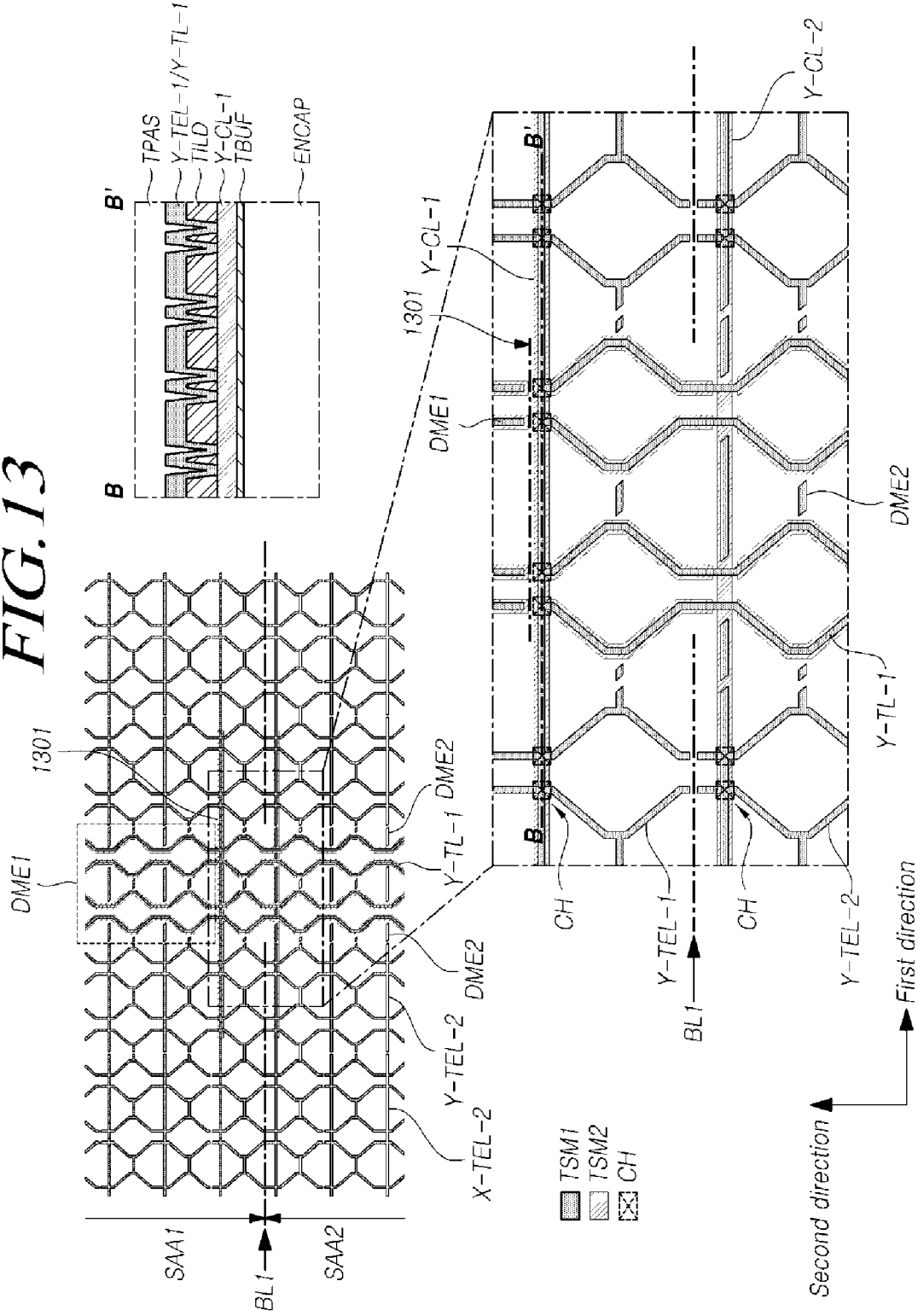

FIG. 11 illustrates an example of a structure of the touch electrode TE disposed on an area where the sub-areas SAA are divided on the active area AA according to an embodiment. FIG. 12 illustrates an example of a structure of the touch routing line TL and the dummy electrode DME disposed on the active area AA according to an embodiment. FIG. 13 illustrates an example of a boundary of the touch routing line TL and the dummy electrode DME on the active area AA according to an embodiment.

Figure 14:
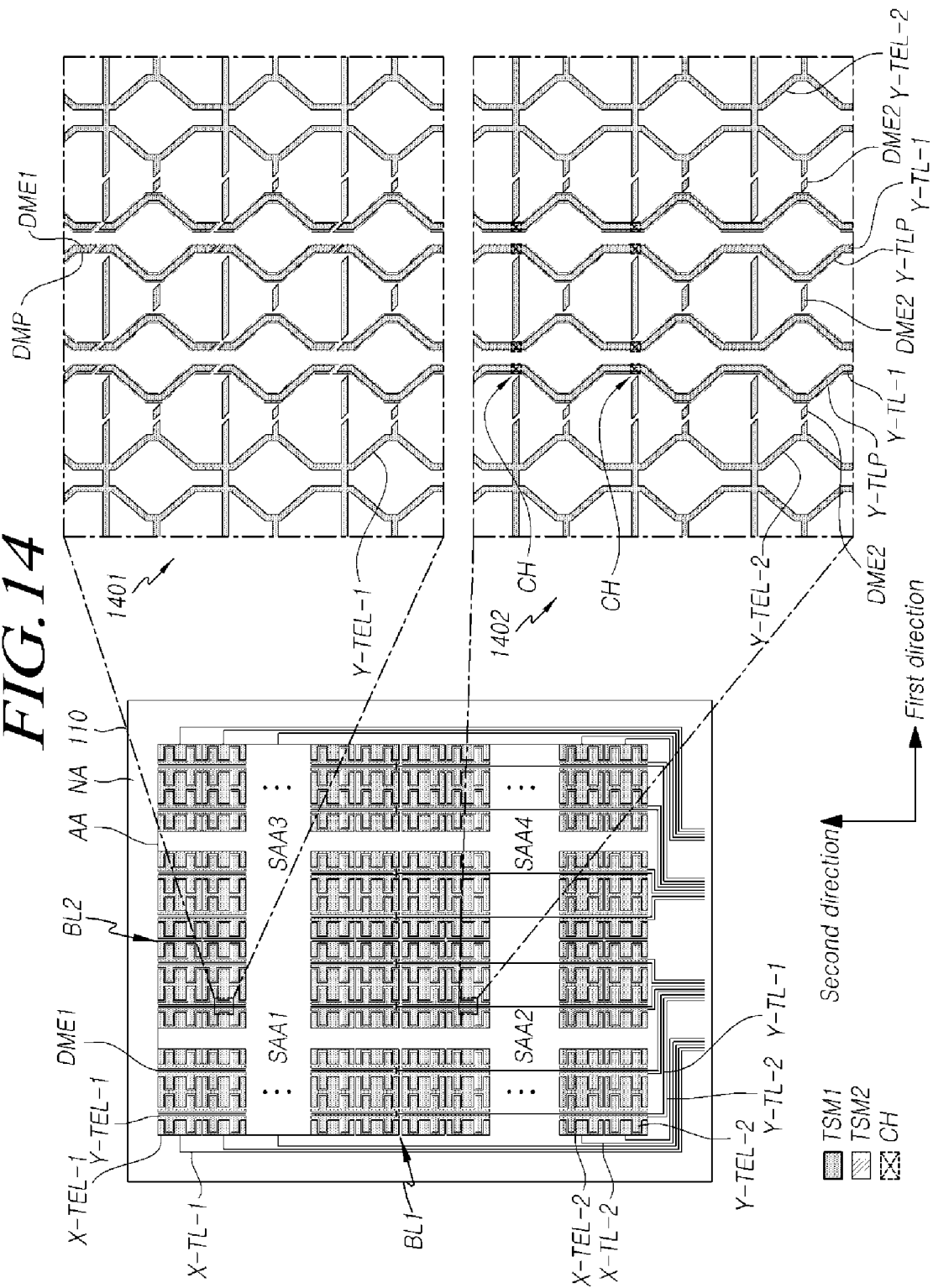
Figure 15:
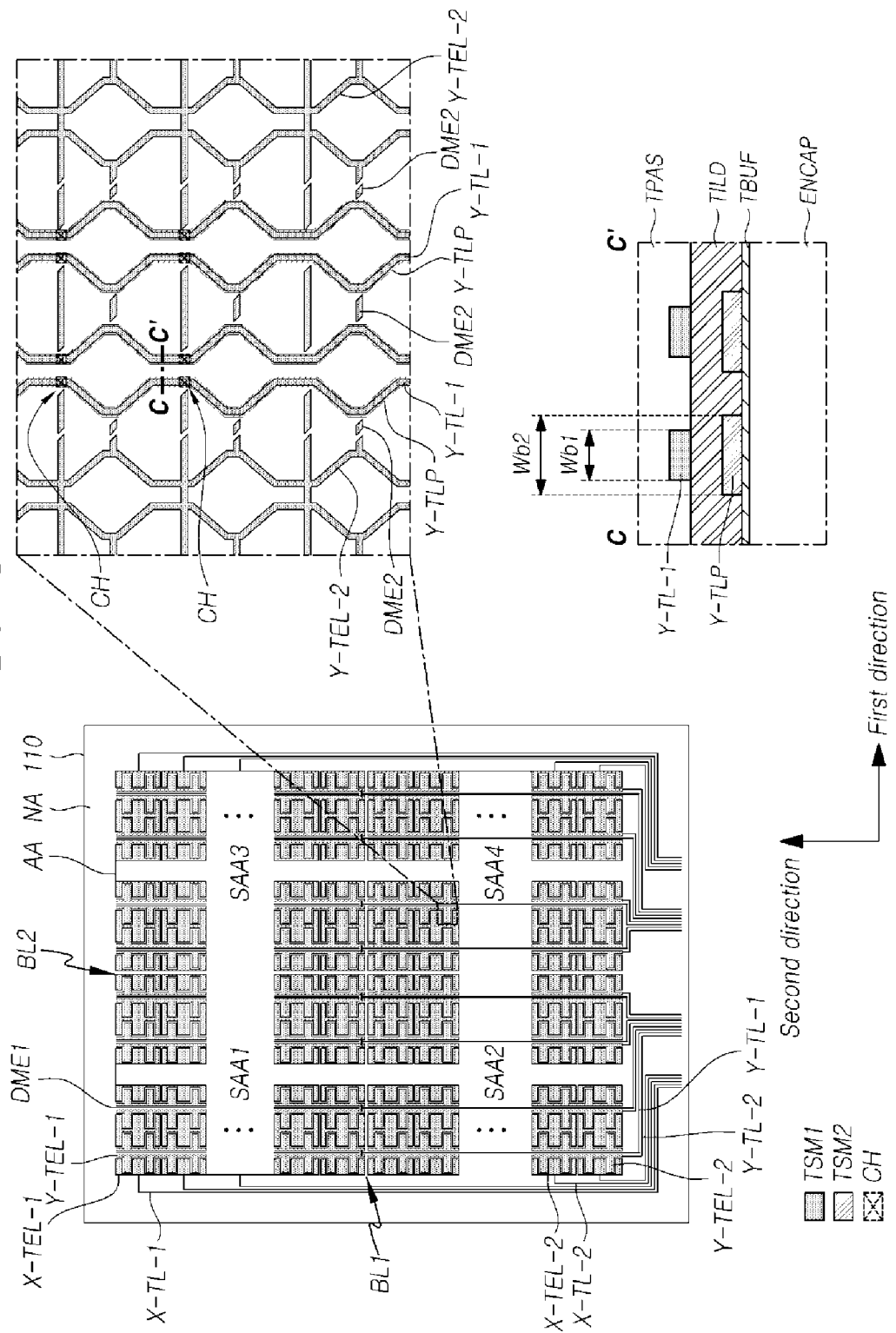

FIG. 14 illustrates other example of a structure of the touch routing line TL and the dummy electrode DME disposed on the active area AA according to an embodiment. FIG. 15 illustrates still other example of the touch routing line TL disposed on the active area AA according to an embodiment.

Referring to FIG. 11, the active area AA of the display panel 110 can be divided as the plurality of sub-areas SAA by the first boundary BL1 and the second boundary BL2. The touch electrode line TEL disposed on each of the plurality of sub-areas SAA can be disposed to be separated from each other. A schematic diagram illustrating an overall structure of the display panel 110 in FIG. 11 illustrates portions made of the first touch sensor metal TSM1 for a convenience of an illustration.

Some of the touch electrode lines TEL disposed on the plurality of sub-areas SAA can be electrically connected to the touch routing line TL disposed on the non-active area NA on the boundary of the active area AA and the non-active area NA.

Other some of the touch electrode lines TEL disposed on the plurality of sub-areas SAA can be electrically connected to the touch routing line TL disposed to pass the active area AA from the non-active area NA on the active area AA.

The touch electrode TE constituting the touch electrode line TEL can include at least one body portion TE-a and the plurality of wing portions TE-b.

The touch electrode line TEL and the touch routing line TL can be implemented by cutting an electrode including the first portion TE_f, the second portion TE_s and the third portion TE_t in a certain direction.

For example, an electrode can be cut on a boundary of the X-touch electrode line X-TEL and the Y-touch electrode line Y-TEL. The electrode can be cut on a boundary of the touch routing line TL, the dummy electrode DME and the touch electrode line TEL. Furthermore, the electrode can be cut on a boundary of the sub-area SAA.

Referring to FIG. 11, an electrode can be cut in the first direction on the first boundary BL1. The electrode can be cut in the second direction on the second boundary BL2.

By cutting the electrode on the first boundary BL1 and the second boundary BL2, the touch electrode line TEL disposed on each of the first sub-area SAA1, the second sub-area SAA2, the third sub-area SAA3 and the fourth sub-area SAA4 can be divided.

The X-touch electrode line X-TEL and the Y-touch electrode line Y-TEL disposed on each sub-area SAA can be implemented by cutting the electrode in the first direction or the second direction.

A space between the touch electrodes TE on the boundary of the sub-area SAA can be identical or similar to a space between the touch electrodes TE inside of the sub-area SAA. As a space between electrodes cut is substantially identical, a difference of visibility may not be generated according to regions of the display panel 110.

The touch routing line TL and the dummy electrode DME can be implemented by cutting an electrode as a similar method to the touch electrode line TEL.

Referring to FIG. 12, a portion indicated by 1201 illustrates an example of an area where the first dummy electrode DME1 is disposed on the first sub-area SAA1. A portion indicated by 1202 illustrates an example of an area where the first Y-touch routing line Y-TL-1 is disposed on the second sub-area SAA2.

The first Y-touch routing line Y-TL-1 can be disposed by cutting an electrode disposed on the second sub-area SAA2.

The first Y-touch routing line Y-TL-1 can be positioned between two parts of the second Y-touch electrode line Y-TEL-2 on the second sub-area SAA2.

At least one first dummy electrode DME1 can be disposed by cutting an electrode disposed on the first sub-area SAA1. The at least one first dummy electrode DME1 can be positioned on an area corresponding to an area where the first Y-touch routing line Y-TL-1 is disposed on the second sub-area SAA2 in the first sub-area SAA1.

The first dummy electrode DME1 can be positioned between the first Y-touch electrode line Y-TEL-1 on the first sub-area SAA1. The plurality of first dummy electrodes DME1 can be separated from each other and can be disposed such as an example illustrated in FIG. 12 so that a defect is not occurred even if a portion of the first dummy electrode DME1 is shorted.

The first dummy electrode DME1 electrically separated from the first Y-touch electrode line Y-TEL-1 can be positioned between the first Y-touch electrode line Y-TEL-1 of the first sub-area SAA1. The first Y-touch routing line Y-TL-1 electrically separated from the second Y-touch electrode line Y-TEL-2 can be positioned between the second Y-touch electrode line Y-TEL-2 of the second sub-area SAA2.

The first dummy electrode DME1 and the first Y-touch routing line Y-TL-1 can be disposed to be corresponded to each other. A width of an area where the first dummy electrode DME1 is disposed can be identical or similar to a width of an area where the first Y-touch routing line Y-TL-1 is disposed. That is, the lower side touch sensor portion can include an area where the first Y-touch routing line Y-TL-1 of the upper side touch sensor portion passes, and in the upper side touch sensor portion, the first dummy electrode DME1 can be provided on an area corresponding to the first Y-touch routing line Y-TL-1 disposed on the lower side touch sensor portion.

At least one second dummy electrode DME2 can be disposed by cutting an electrode portion between the first Y-touch routing line Y-TL-1 and the second Y-touch electrode line Y-TEL-2 on the second sub-area SAA2.

The second dummy electrode DME2 can be disposed to be electrically separated from the first Y-touch routing line Y-TL-1 and the second Y-touch electrode line Y-TEL-2.

The first dummy electrode DME1 can be positioned on a portion of the first sub-area SAA1 corresponding an area where the second dummy electrode DME2 is disposed on the second sub-area SAA2. Some of the first dummy electrodes DME1 can be disposed to be corresponded to the second dummy electrode DME2.

The second dummy electrode DME2 can be disposed to prevent or reduce a drop of visibility due to an arrangement of the touch electrode line TEL. Alternatively, the second dummy electrode DME2 can be disposed to prevent a short circuit between the first Y-touch routing line Y-TL-1 and the second Y-touch electrode line Y-TEL-2.

The first dummy electrode DME1 can be disposed, or the first Y-touch routing line Y-TL-1 and the second dummy electrode DME2 can be disposed on an area corresponding to each other on the first sub-area SAA1 and the second sub-area SAA2. An area of the area where the Y-touch electrode line Y-TEL is disposed on each of the first sub-area SAA1 and the second sub-area SAA2 can be identical or similar. A space between two parts of the first Y-touch electrode line Y-TEL-1 disposed separately on both sides of the first dummy electrode DME1 on the first sub-area SAA1 can be identical or similar to a space between two parts of the second Y-touch electrode line Y-TEL-2 disposed separately on both sides of the first Y-touch routing line Y-TL-1 on the second sub-area SAA2.

The first dummy electrode DME1 and the second dummy electrode DME2 can be disposed by cutting an electrode similarly with the touch electrode line TEL or the touch routing line TL. The dummy electrode DME can be disposed by cutting an electrode in the first direction or the second direction similarly with the touch electrode line TEL or the like.

Alternatively, at least one of the first dummy electrode DME1 or the second dummy electrode DME2 can be disposed to be cut in different direction from a direction that the touch electrode line TEL and the touch routing line TL are cut.

For example, the touch electrode line TEL and the touch routing line TL, such as described above, can be disposed by cutting an electrode in the first direction or the second direction. Whereas, the first dummy electrode DME1 and the second dummy electrode DME2 can be disposed by cutting an electrode in a direction other than the first direction and the second direction. Both sides (ends) of each of the first dummy electrode DME1 and the second dummy electrode DME2 can be a shape cut in the third direction different from the first direction and the second direction.

For example, the dummy electrode DME can be disposed by cutting an electrode in a diagonal direction on a boundary of the dummy electrode DME and the touch electrode line TEL or the touch routing line TL. Both sides of the dummy electrode DME can be a shape cut in the diagonal direction. In the case that a boundary of the dummy electrode DME is a shape cut in the diagonal direction, an area of an end portion of the dummy electrode DME can be greater than an area of an end portion of the touch electrode line TEL or an end portion of the touch routing line TL.

A boundary between the touch electrode line TEL and the touch electrode line TEL, a boundary between the touch electrode line TEL and the touch routing line TL can be shapes that an electrode is cut in the first direction or the second direction.

A boundary between the dummy electrode DME and the touch electrode line TEL, a boundary between the dummy electrode DME and the touch routing line TL, and a boundary between the dummy electrodes DME can be shapes cut in the third direction (e.g., the diagonal direction) different from the first direction and the second direction.

The dummy electrode DME can have a shape that an electrode is cut in the diagonal direction on a boundary of the dummy electrode DME. The touch electrode line TEL or the touch routing line TL can include a protrusion which protrudes toward the dummy electrode DME and has a shape cut in the diagonal direction on a boundary of the dummy electrode DME and the touch electrode line TEL or the touch routing line TL.

As a cutting direction of a boundary of the dummy electrode DME is different from a cutting direction of a boundary of the touch electrode line TEL or the touch routing line TL, a repair process can be easier in an inspection process of the touch sensor structure.

For example, in the case that a shorted portion between electrodes is present on a boundary that electrodes are cut in the first direction or the second direction, the repair process to cut the shorted portion is necessary since the corresponding area is a boundary between the touch electrode lines TEL or a boundary between the touch electrode line TEL and the touch routing line TL.

In the case that a shorted portion between electrodes is present on a boundary that the electrodes are cut in the diagonal direction, as at least one of the shorted electrodes is the dummy electrode DME, it may not affect the touch sensor structure even if the shorted portion is not cut. Thus, the inspection process can be terminated without the repair process. In this case, the dummy electrode DME can be disposed as a structure that the dummy electrode DME is connected to the touch electrode line TEL or the touch routing line TL on the active area AA.

Such as described above, by the arrangement of the dummy electrode DME, an area of the touch electrode line TEL can be uniform, and visibility can be improved. Furthermore, as a cutting direction on a boundary of the dummy electrode DME is different from a cutting direction on a boundary of the touch electrode line TEL or the like, an efficiency of the inspection process can be increased.

Although examples above-mentioned describe cases that the dummy electrode DME is disposed on an area corresponding to the touch routing line TL or a periphery of the touch routing line TL only, in some cases, the dummy electrode DME can be disposed inside of the touch electrode line TEL or a boundary area between the touch electrode lines TEL. In this case, the dummy electrode DME can be positioned uniformly on each area.

A boundary between the first dummy electrode DME1 disposed on the first sub-area SAA1 and the first Y-touch routing line Y-TL-1 electrically connected to the first Y-touch electrode line Y-TEL-1 of the first sub-area SAA1 can be cut in a similar manner.

Referring to FIG. 13, a portion indicated by 1301 represents a boundary between the first Y-touch routing line Y-TL-1 and the first dummy electrode DME1.

A boundary between the first Y-touch routing line Y-TL-1 and the first dummy electrode DME1 can be a shape that an electrode is cut in the diagonal direction.

Alternatively, in some cases, a boundary between the first Y-touch routing line Y-TL-1 and the first dummy electrode DME1 can be a shape cut in the first direction. As a plurality of first dummy electrodes DME1 are disposed to be separated from each other, only a boundary of the first dummy electrode DME1 which is the most adjacent to the first Y-touch routing line Y-TL-1 may not be a shape cut in the diagonal direction.

As the first Y-touch routing line Y-TL-1 is electrically connected to the first Y-touch electrode line Y-TEL-1 disposed on the first sub-area SAA1, a boundary between the first Y-touch routing line Y-TL-1 and the first dummy electrode DME1 can be different from a boundary between the first sub-area SAA1 and the second sub-area SAA2. For example, the boundary between the first Y-touch routing line Y-TL-1 and the first dummy electrode DME1 can be positioned inside of the first sub-area SAA1.

The first Y-touch routing line Y-TL-1 can be directly connected to the first Y-touch electrode line Y-TEL-1 inside of the first sub-area SAA1. The first Y-touch routing line Y-TL-1 and the first Y-touch electrode line Y-TEL-1 can be directly connected to each other since both of them are made of the first touch sensor metal TSM1.

Alternatively, the first Y-touch routing line Y-TL-1 can be electrically connected to the first Y-touch electrode line Y-TEL-1 by the first Y-touch electrode connecting pattern Y-CL-1 made of the second touch sensor metal TSM2.

The first Y-touch routing line Y-TL-1 and the first Y-touch electrode line Y-TEL-1 can be electrically connected to each other by the first Y-touch electrode connecting pattern Y-CL-1 positioned on an upper side of the first boundary BL1. Two parts of the second Y-touch electrode line Y-TEL-2 disposed on the second sub-area SAA2 can be electrically connected to each other by the second Y-touch electrode connecting pattern Y-CL-2 positioned on a lower side of the first boundary BL1.

In the case that the first Y-touch routing line Y-TL-1 and the first Y-touch electrode line Y-TEL-1 are connected by the first Y-touch electrode connecting pattern Y-CL-1, the first Y-touch routing lien Y-TL-a and the first Y-touch electrode line Y-TEL-1 can be connected to each other or can be separated from each other on a layer where the first touch sensor metal TSM1 is disposed.

In the case that the first Y-touch routing line Y-TL-1 and the first Y-touch electrode line Y-TEL-1 are disposed to be separated from each other on a layer where the first touch sensor metal TSM1 is disposed, a boundary between the first Y-touch routing line Y-TL-1 and the first Y-touch electrode line Y-TEL-1 can be a diagonal shape. As the repair process for cutting is not required even if the first Y-touch routing line Y-TL-1 and the first Y-touch electrode line Y-TEL-1 made of the first touch sensor metal TSM1 are shorted, a boundary between the first Y-touch routing line Y-TL-1 and the first Y-touch electrode line Y-TEL-1 made of the first touch sensor metal TSM1 can be cut in the diagonal direction in a process cutting the dummy electrode DME for a convenience of the process.

Such as described above, the first Y-touch routing line Y-TL-1 and the first Y-touch electrode line Y-TEL-1 can be electrically connected to each other as various shapes on the first sub-area SAA1. For reducing a load of the first Y-touch routing line Y-TL-1 disposed on the active area AA, a pattern for a resistance decrease can be further disposed under the first Y-touch routing line Y-TL-1.

Referring to FIG. 14, a portion indicated by 1401 illustrates an example of an area where the first dummy electrode DME1 is disposed on the first sub-area SAA1. A portion indicated by 1402 illustrates an example of an area where the first Y-touch routing line Y-TL-1 and the second dummy electrode DME2 are disposed on the second sub-area SAA2. The lower side touch sensor portion has an area where the first Y-touch routing line Y-TL-1 of the upper side touch sensor portion passes, and the first dummy electrode DME1 can be disposed on an area of the upper side touch sensor portion corresponding to the first Y-touch routing line Y-TL-1 disposed on the lower side touch sensor portion.

Referring to the portion indicated by 1402, at least one Y-auxiliary routing pattern Y-TLP made of the second touch sensor metal TSM2 can be disposed on an area of the second sub-area SAA2 overlapping the first Y-touch routing line Y-TL-1 made of the first touch sensor metal TSM1.

The Y-auxiliary routing pattern Y-TLP can be disposed on an area other than an area where the X-touch electrode connecting pattern X-CL or the Y-touch electrode connecting pattern Y-CL made of the second touch sensor metal TSM2 is disposed. The Y-auxiliary routing pattern Y-TLP can be disposed to be separated from the X-touch electrode connecting pattern X-CL and the Y-touch electrode connecting pattern Y-CL.

The Y-auxiliary routing pattern Y-TLP can be disposed to overlap at least a part of the first Y-touch routing line Y-TL-1.

The Y-auxiliary routing pattern Y-TLP can be electrically connected to the first Y-touch routing line Y-TL-1 through the contact hole CH on at least one point.

As the Y-auxiliary routing pattern Y-TLP is electrically connected to the first Y-touch routing line Y-TL-1, a resistance of the first Y-touch routing line Y-TL-1 can be reduced. A load of the first Y-touch routing line Y-TL-1 disposed on the active area AA can be reduced.

Referring to the portion indicated by 1401, at least one dummy pattern DMP made of the second touch sensor metal TSM2 can be disposed on an area overlapping the first dummy electrode DME1 on the first sub-area SAA1.

The dummy pattern DMP can have an identical or a similar shape to a shape of the first dummy electrode DME1. A boundary of the dummy pattern DMP can be a diagonal shape such as a boundary of the first dummy electrode DME1. The dummy pattern DMP can be electrically connected to the first dummy electrode DME1, or can be insulated from the first dummy electrode DME1. The dummy pattern DMP and the first dummy electrode DME1 can be floated.

As the Y-auxiliary routing pattern Y-TLP is disposed on an area overlapping the first Y-touch routing line Y-TL-1 on the second sub-area SAA2, by arranging the dummy pattern DMP on an area overlapping the first dummy electrode DME1 on the first sub-area SAA1, a difference of visibility according to the sub-area SAA is prevented from occurring.

Furthermore, a width of the Y-auxiliary routing pattern Y-TLP or the dummy pattern DMP can be adjusted in a range not affecting the visibility.

Referring to FIG. 15, it illustrates an example of an area where the first Y-touch routing line Y-TL-1 and the Y-auxiliary routing pattern Y-TLP are disposed on the second sub-area SAA2.

The Y-auxiliary routing pattern Y-TLP can be disposed on an area overlapping the first Y-touch routing line Y-TL-1.

The Y-auxiliary routing pattern Y-TLP can be electrically connected to the first Y-touch routing line Y-TL-1 through the contact hole CH.

A width of the Y-auxiliary pattern Y-TLP can be different from a width of the first Y-touch routing line Y-TL-1.

For example, a width Wb2 of the Y-auxiliary routing pattern Y-TLP can be greater than a width Wb1 of the first Y-touch routing line Y-TL-1.

Furthermore, since the first Y-touch routing line Y-TL-1 and the Y-auxiliary routing pattern Y-TLP are disposed to avoid the light-emitting area of the light-emitting elements ED, each of the first Y-touch routing line Y-TL-1 and the Y-auxiliary routing pattern Y-TLP can include an opened portion corresponding to the light-emitting area of the light-emitting elements ED. As a width of the Y-auxiliary routing pattern Y-TLP is greater than a width of the first Y-touch routing line Y-TL-1, a size of the opened portion included in the first Y-touch routing line Y-TL-1 can be greater than a size of the opened portion included in the Y-auxiliary routing pattern Y-TLP and corresponding to the opened portion included in the first Y-touch routing line Y-TL-1.

As the Y-auxiliary routing pattern Y-TLP is positioned under the first Y-touch routing line Y-TL-1, thus it can be positioned farther than the first Y-touch routing line Y-TL-1 from outside of the display panel 110. Even if a width of the Y-auxiliary routing pattern Y-TLP is greater than a width of the first Y-touch routing line Y-TL-1, compared to the case that the width of the first Y-touch routing line Y-TL-1 is greater than the width of the Y-auxiliary routing pattern Y-TLP, a degree that visibility is reduced can be smaller.

As the width of the Y-auxiliary routing pattern Y-TLP increases while preventing or reducing visibility drop, a resistance of the first Y-touch routing line Y-TL-1 electrically connected to the Y-auxiliary routing pattern Y-TLP can be further reduced.

Furthermore, in this case, a width of the dummy pattern DMP overlapping the first dummy electrode DME1 disposed on the first sub-area SAA1 can be greater than a width of the first dummy electrode DME1. By increasing the width of the dummy pattern DMP positioned under the first dummy electrode DME1, a difference of visibility on the first sub-area SAA1 and the second sub-area SAA2 can be prevented or at least reduced.

Such as described above, by arranging the auxiliary routing pattern TLP on an area overlapping the touch routing line TL disposed on the active area AA, a load of the touch routing line TL can be reduced and a performance of the touch sensing can be improved in a range not dropping the image display performance.

Such as described above, according to embodiments of the present disclosure, by implementing the touch sensor structure using the first touch sensor metal TSM1 and the second touch sensor metal TSM2 on the active area AA, the touch sensor structure that the touch sensing performance is improved can be provided while reducing an influence to the image display performance.

Figure 16:
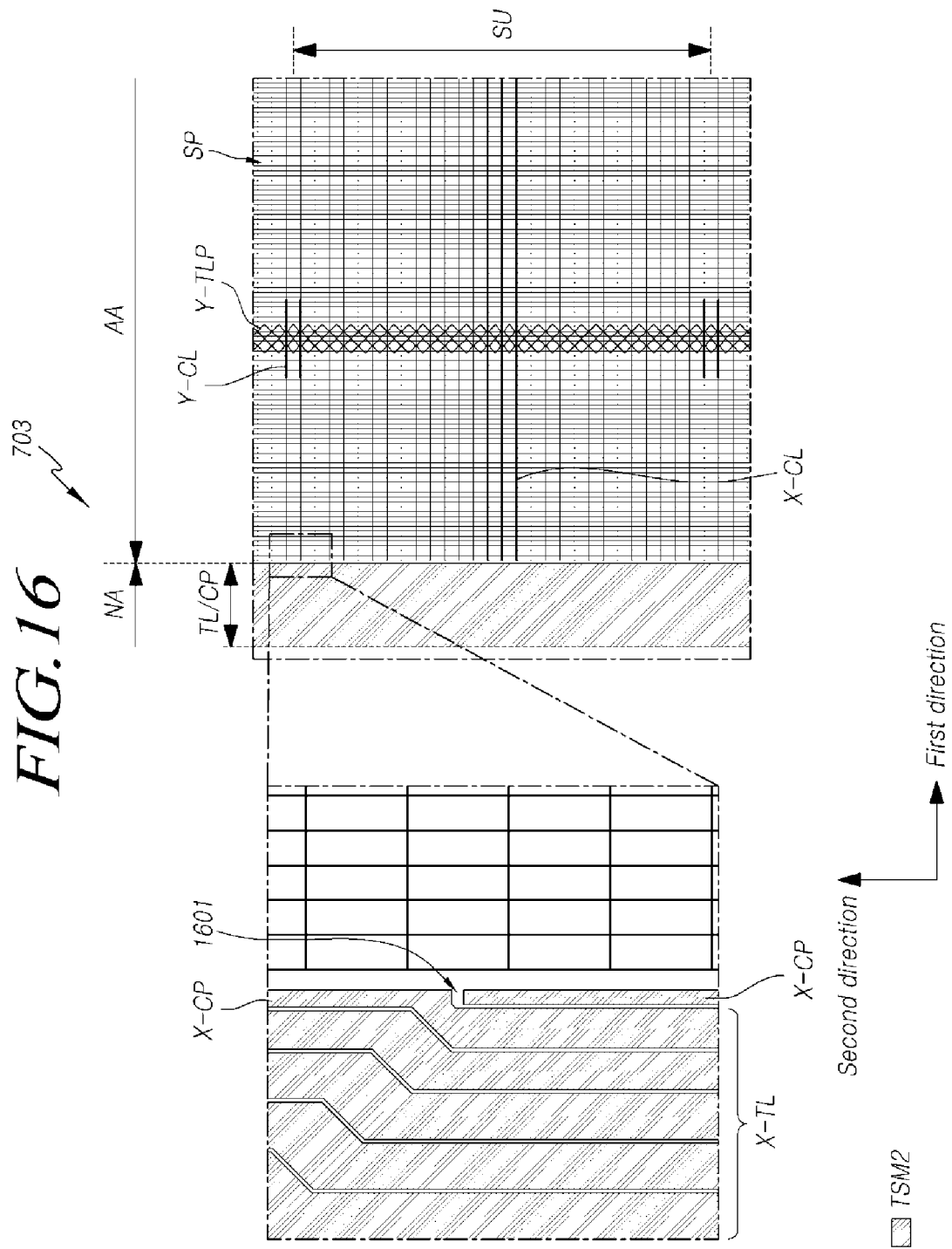
FIG. 16 is a diagram illustrating a specific example that a touch sensor structure of a touch display device is implemented on a peripheral area of a boundary of an active area and a non-active area of a display panel according to embodiments of the present disclosure.

FIG. 16 is a diagram illustrating a specific example that a touch sensor structure of the touch display device 100 according to embodiments of the present disclosure is implemented on a peripheral area of a boundary of the active area AA and the non-active area NA of the display panel 110. FIG. 16 exemplary illustrates a specific structure that the second touch sensor metal TSM2 is disposed on an area indicated by 703 illustrated in FIG. 7.

Referring to FIG. 16, it illustrates an example of a structure of the second touch sensor metal TSM2 disposed on an area including one sensing unit SU on one side boundary of the active area AA.

The X-touch electrode connecting pattern X-CL for a connection of the X-touch electrode X-TE can be disposed on the active area AA. The X-touch electrode connecting pattern X-CL can be connected to the X-touch electrode contact pad X-CP positioned outside of the active area AA. The X-touch electrode contact pad X-CP can be connected to the X-touch routing line X-TL.

At least one Y-touch electrode connecting pattern Y-CL made of the second touch sensor metal TSM2 can be disposed on an area adjacent to an upper side boundary and a lower side boundary of the sensing unit SU.

The Y-touch electrode connecting pattern Y-CL can electrically connect two parts of the Y-touch electrode line Y-TEL separated by the Y-touch routing line Y-TL or the first dummy electrode DME1.

Two or more Y-touch electrode connecting pattern Y-CL can be disposed on one sensing unit SU, and the Y-touch electrode connecting pattern Y-CL can be disposed on various positions. As the Y-touch electrode connecting pattern Y-CL connects the Y-touch electrode Y-TE separated on an upper side and a lower side of each sensing unit SU, the Y-touch electrode Y-TE can have a similar state to a structure not separated.

As the Y-touch electrode connecting pattern Y-CL is positioned on boundaries of an upper side and a lower side of the sensing unit SU, a point that the X-touch electrode contact pad X-CP connected to the X-touch electrode line X-TEL is divided can be positioned between adjacent Y-touch electrode connecting patterns Y-CL.

For example, such as a portion indicated by 1601, a boundary between the X-touch contact pads X-CP can be identical to a boundary of the sensing unit SU.

As the Y-touch electrode connecting patterns Y-CL are disposed on both sides of a boundary of the sensing unit SU, a boundary between the X-touch electrode contact pads X-CP can be positioned between adjacent Y-touch electrode connecting patterns Y-CL.

A Y-auxiliary routing pattern Y-TLP can be disposed on an area other than an area where the X-touch electrode connecting pattern X-CL and the Y-touch electrode connecting pattern Y-CL are disposed on a layer where the second touch sensor metal TSM2 is disposed.

The Y-auxiliary routing pattern Y-TLP can be disposed to be separated from the X-touch electrode connecting pattern X-CL and the Y-touch electrode connecting pattern Y-CL. The Y-auxiliary routing pattern Y-TLP can be electrically connected to the Y-touch routing line Y-TL overlapping the Y-auxiliary routing pattern Y-TLP and can reduce a resistance of the Y-touch routing line Y-TL disposed on the active area AA.

The second touch sensor metal TSM2 disposed on an area overlapping the first dummy electrode DME1 can be disposed as a shape similar to the first dummy electrode DME1 and can constitute a dummy pattern DMP.

The dummy pattern DMP can be disposed on an area other than an area where the X-touch electrode connecting pattern X-CL, the Y-touch electrode connecting pattern Y-CL and the Y-auxiliary routing pattern Y-TLP are disposed on a layer where the second touch sensor metal TSM2 is disposed. As the dummy pattern DMP is disposed on an area overlapping the touch electrode line TEL, a visibility difference with an area where the touch routing line TL and the auxiliary routing pattern TLP are disposed to overlap each other can be prevented or at least reduced.

As only the X-touch routing line X-TL driving the X-touch electrode line X-TEL disposed on a corresponding sub-area SAA is disposed on a boundary area of both sides of the active area AA, an arrangement of the X-touch routing line X-TL can be easy. The X-touch routing line X-TL can be made of at least one of the first touch sensor metal TSM1 or the second touch sensor metal TSM2 and can be implemented as a shape reducing a line resistance.

Figure 17:
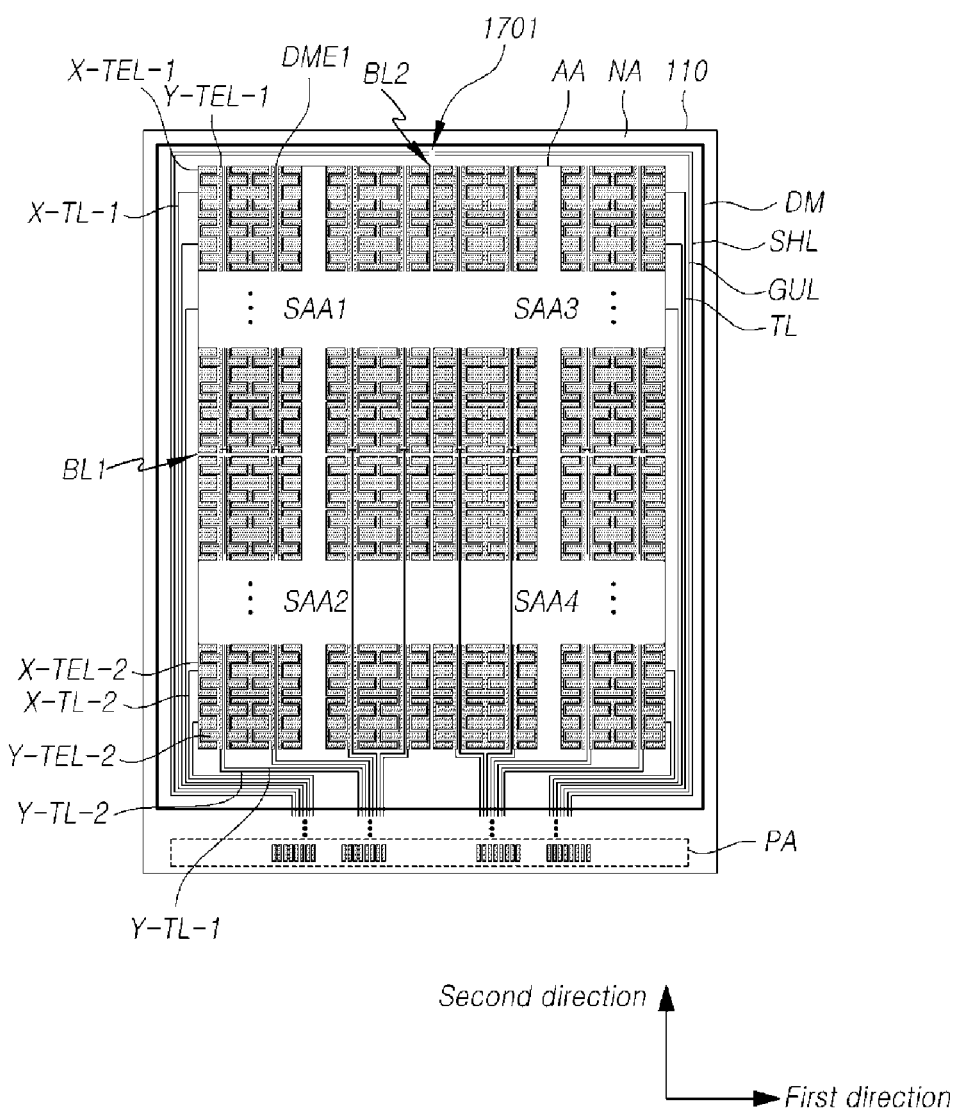
FIG. 17 is a diagram illustrating a specific example that a touch sensor structure of a touch display device is implemented between an active area of a display panel and a dam of a non-active area according to embodiments of the present disclosure.

FIG. 17 is a diagram illustrating a specific example that a touch sensor structure of the touch display device 100 is implemented between the active area AA of the display panel 110 and a dam DM of the non-active area NA according to embodiments of the present disclosure.

Referring to FIG. 17, at least one dam DM can be disposed on the non-active area NA of the display panel 110. The at least one dam DM can be disposed to surround the active area AA. The at least one dam DM can be positioned on an outer portion of the encapsulation layer ENCAP. The at least one dam DM can be a part of the encapsulation layer ENCAP.

The plurality of touch routing lines TL can be positioned inside of the at least one dam DM on the non-active area NA. The plurality of touch routing line TL can be positioned between the active area AA and the at least one dam DM on area other than a pad area PA.

As the plurality of touch routing lines TL are positioned inside of the at least one dam DM, the touch routing line TL can be disposed while reducing an increase of the non-active area NA.

At least one shield line SHL can be disposed to surround at least a portion of the plurality of touch routing line TL. The shield line SHL can be positioned between the touch routing line TL positioned outermost of the plurality of the touch routing lines TL and the dam DM.

The shield line SHL can be made of a same material to the touch routing line TL. For example, the shield line SHL can be made of at least one of the first touch sensor metal TSM1 or the second touch sensor metal TSM2.

The shield line SHL can be grounded. Alternatively, the shield line SHL can receive a signal different from a signal supplied through the touch routing line TL.

As the shield line SHL is disposed to encompass outside of the touch routing line TL, the shield line SHL can block an external noise and can prevent or reduce that the external noise affect a signal of the touch routing line TL.

At least one guard line GUL can be disposed between the touch routing line TL and the shield line SHL.

The guard line GUL can be made of a same material to the touch routing line TL. For example, the guard line GUL can be made of at least one of the first touch sensor metal TSM1 or the second touch sensor metal TSM2.

As the guard line GUL is positioned between the touch routing line TL and the shield line SHL, the guard line GUL can block that a parasitic capacitance is formed between the touch routing line TL and the shield line SHL. As the parasitic capacitance between the touch routing line TL and the shield line SHL is blocked, it can be blocked that a fluctuation of a signal or a voltage state of the shield line SHL affects the touch routing line TL.

The guard line GUL can be supplied a signal corresponding to a signal applied to the touch routing line TL positioned the most adjacent to the guard line GUL among the plurality of touch routing lines TL. The guard line GUL can be supplied a signal corresponding to a signal applied to the touch routing line TL positioned outmost among the plurality of touch routing lines TL.

A signal corresponding to a signal applied to the touch routing line TL can mean a signal which is identical to at least one of a frequency, an amplitude or a phase of a signal applied to the touch routing line TL.

For example, the guard line GUL can be supplied a signal identical to a signal applied to the touch routing line TL positioned the most adjacent to the guard line GUL at an identical timing. A parasitic capacitance may not be formed between the touch routing line TL positioned the most adjacent to the guard line GUL and the guard line GUL. An indirect noise by the shield line SHL can be blocked by the guard line GUL.

Such as described above, it can be blocked by the shield line SHL that an external noise affects the touch routing line TL directly. Furthermore, it can be blocked by the guard line GUL that an indirect noise by the shield line SHL affects the touch routing line TL. A noise of a signal detected through the touch routing line TL can be prevented or reduced by the shield line SHL and the guard line GUL, and a signal difference according to positions of the touch routing lines TL can be prevented or reduced.

At least one of the shield line SHL or the guard line GUL can be disposed to be divided on the non-active area NA.

For example, the shield line SHL and the guard line GUL, such as a portion indicated by 1701, can be disposed to be divided on an extended line of the second boundary BL2.

The touch electrode line TEL disposed on the first sub-area SAA1 and the touch electrode line TEL disposed on the third sub-area SAA3 can be disposed to be separated from each other and can be driven independently. A minute difference of driving timings of the touch routing lines TL supplying signals to the touch electrode lines TEL disposed on each of the first sub-area SAA1 and the third sub-area SAA3 can be present.

The guard line GUL being supplied a signal corresponding to a signal applied to the touch routing line TL can be disposed to be divided to be corresponded to the sub-area SAA driven by the corresponding touch routing line TL.

For example, as the guard line GUL positioned on sides of the first sub-area SAA1 and the second sub-area SAA2 of the display panel 110 is the most adjacent to the touch routing line TL driving the first sub-area SAA1, it can be disposed to surround outside of the first sub-area SAA1.

As the guard line GUL positioned on sides of the third sub-area SAA3 and the fourth sub-area SAA4 of the display panel 110 is the most adjacent to the touch routing line TL driving the third sub-area SAA3, it can be disposed to surround outside of the third sub-area SAA3.

Each guard line GUL positioned on both sides of the display panel 110 can be supplied a signal corresponding to a signal applied to the touch routing line TL at a timing that a signal is applied to adjacent touch routing line TL.

In a structure that the touch electrode line TEL disposed on the active area AA is divided as the sub-area SAA and driven, a noise to the touch routing line TL driving each sub-area SAA can be blocked more accurately.

Examples above-mentioned are examples that the guard line GUL is divided in a structure that the active area AA is divided as four sub-areas SAA, but the guard line GUL can be disposed to be divided variously according to a divided structure of the sub-area SAA.

Furthermore, the shield line SHL positioned outside of the guard line GUL can be disposed to be divided to correspond to a divided structure of the guard line GUL.

For example, the shield line SHL can be disposed to be divided on an extended line of the second boundary BL2. Alternatively, in some cases, the shield line SHL can be disposed not to be divided.

Grounded shield line SHL can disposed to surround lines disposed on the non-active area NA and can block an external noise. The guard line GUL positioned adjacent to the touch routing line TL can be disposed to be divided to be corresponded to the touch routing line TL or the sub-area SAA driven by the touch routing line TL, and can block a parasitic capacitance between lines, and can improve an effect of a noise blocking.

At least one of the touch routing line TL, the guard line GUL or the shield line SHL disposed on the non-active area NA can be electrically connected to a pad disposed on the pad area PA and can be supplied a signal.

Figure 18:
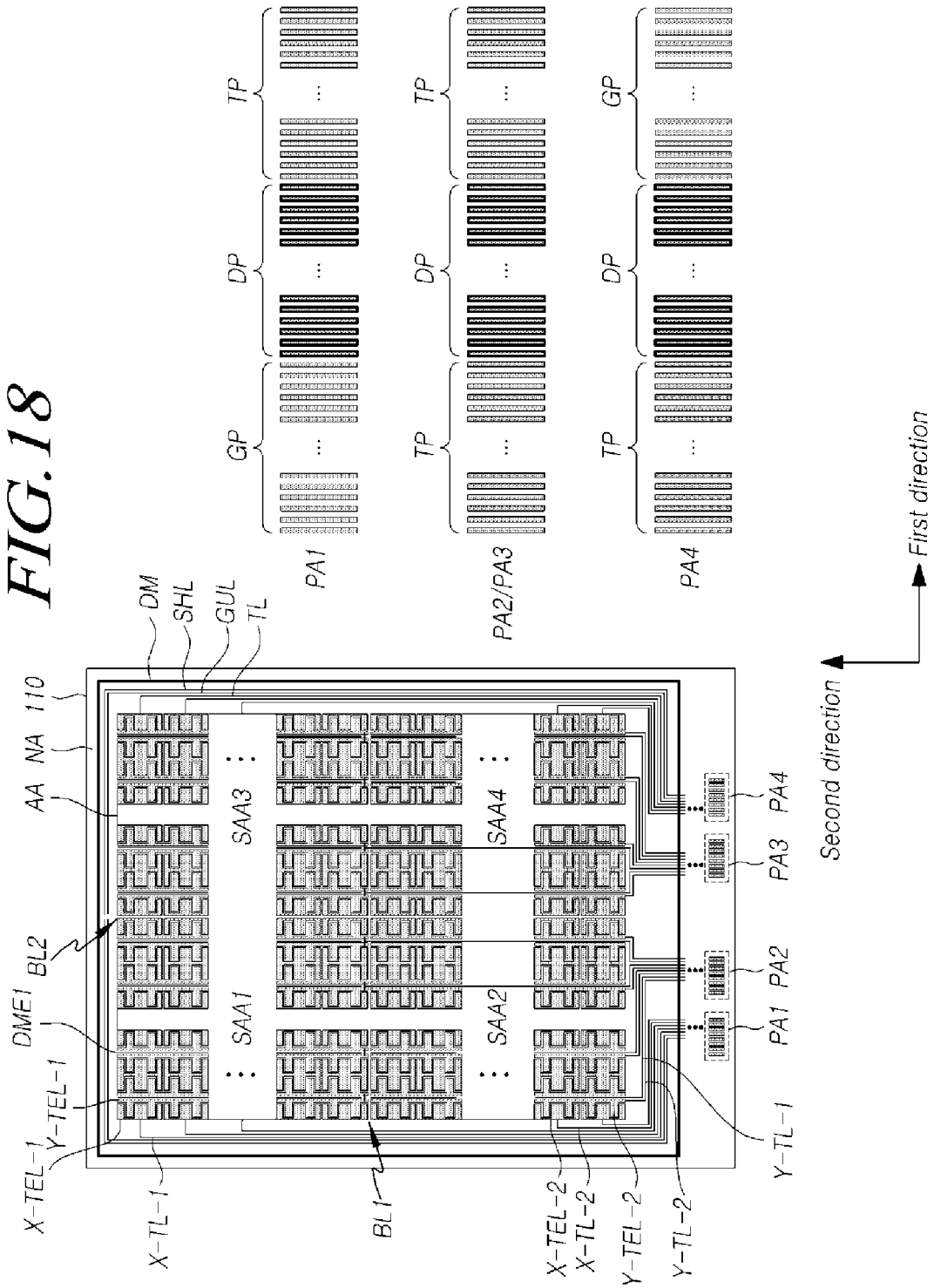
FIG. 18 is a diagram illustrating a specific example that a touch sensor structure of a touch display device is implemented on a non-active area including a pad area of a display panel according to embodiments of the present disclosure.

FIG. 18 is a diagram illustrating a specific example that a touch sensor structure of the touch display device 100 is implemented on the non-active area NA including the pad area PA of the display panel 110 according to embodiments of the present disclosure.

Referring to FIG. 18, the pad area PA where a plurality of pads are disposed can be positioned on at least one side of the display panel 110.

A plurality of display pads electrically connected to lines supplying a signal for the display driving and a plurality of touch pads TP electrically connected to lines supplying a signal for the touch sensing can be disposed on the pad area PA.

The plurality of touch routing lines TL can be extended from the active area AA to the non-active area NA and can pass over the dam DM. The touch routing line TL can pass over the dam DM and can be electrically connected to the touch pad TP disposed on the pad area PA.

The plurality of display signal lines DSL can be disposed to be extended from the active area AA to the non-active area NA. As the display signal line DSL is disposed under the encapsulation layer ENCAP, it can be disposed to pass under the dam DM. The display signal line DSL can be electrically connected to the display pad disposed on the pad area PA.

At least some of each of the display pads and the touch pads TP can be disposed by using a material constituting the touch electrode TE and the touch routing line TL. At least some of each of the display pads and the touch pads TP can be disposed by using a material constituting the display signal line DSL.

Various pads can be constituted by electrically connecting a pad portion made of the material constituting the touch electrode TE and the touch routing line TL and a pad portion made of the material constituting the display signal line DSL on the pad area PA.

A plane structure that the display pad and the touch pad TP are disposed can be various according to a position of the pad area PA.

For example, the pad area PA can be divided to correspond to the sub-area SAA of the active area AA. For example, the pad area PA can include four pad areas PA1, PA2, PA3, PA4.

A gate pad GP supplying a signal or a voltage related to a diving of the gate driving circuit 120, a data pad DP supplying a signal or a voltage related to a driving of the data driving circuit 130 and the touch pad TP can be disposed on a first pad area PA1.

The touch pad TP disposed on the first pad area PA1 can be electrically connected to the X-touch routing line X-TL driving the X-touch electrode line X-TEL disposed on the first sub-area SAA1 and the second sub-area SAA2. In some cases, some of the touch pads TP disposed on the first pad area PA1 can be electrically connected to the Y-touch routing line Y-TL driving the Y-touch electrode line Y-TEL disposed on the first sub-area SAA1 and the second sub-area SAA2.

At least some of the touch pads TP disposed on the first pad area PA1 can be disposed symmetrically to the display pad. For example, the touch pad TP can be disposed symmetrically to the gate pad GP. In this case, the touch routing line TL connected to the touch pad TP can be disposed symmetrically to the display signal line DSL connected to the gate pad GP.

The data pad DP supplying a signal or a voltage related to a driving of the data driving circuit 130 and the touch pad TP can be disposed on the second pad area PA2 and the third pad area PA3.

The touch pad TP disposed on each of the second pad area PA2 and the third pad area PA3 can be disposed symmetrically. The data pad DP can be disposed between some and others of the touch pad TP disposed symmetrically.

The touch pad TP disposed on the second pad area PA2 can be electrically connected to the Y-touch routing line Y-TL driving the Y-touch electrode line Y-TEL disposed on the first sub-area SAA1 and the second sub-area SAA2. The touch pad TP disposed on the third pad area PA3 can be electrically connected to the Y-touch routing line Y-TL driving the Y-touch electrode line Y-TEL disposed on the third sub-area SAA3 and the fourth sub-area SAA4.

In some cases, some of the touch pads TP disposed on the second pad area PA2 can be electrically connected to the Y-touch routing line Y-TL driving the third sub-area SAA3 and the fourth sub-area SAA4. Some of the touch pads TP disposed on the third pad area PA3 can be electrically connected to the Y-touch routing line Y-TL driving the first sub-area SAA1 and the second sub-area SAA2.

Furthermore, in some cases, some of the touch pads TP disposed on the second pad area PA2 can be electrically connected to the X-touch routing line X-TL driving the X-touch electrode line X-TEL disposed on the first sub-area SAA1 and the second sub-area SAA2. Some of the touch pads TP disposed on the third pad area PA3 can be electrically connected to the X-touch routing line X-TL driving the X-touch electrode line X-TEL disposed on the third sub-area SAA3 and the fourth sub-area SAA4.

The touch pad TP, the data pad DP and the gate pad GP can be disposed on the fourth pad area PA4. The pads disposed on the fourth pad area PA4 can be disposed symmetrically to the pads disposed on the first pad area PA1.

The touch pad TP disposed on the fourth pad area PA4 can be electrically connected to the X-touch routing line X-TL driving the X-touch electrode line X-TEL disposed on the third sub-area SAA3 and the fourth sub-area SAA4. In some cases, some of the touch pads TP disposed on the fourth pad area PA4 can be electrically connected to the Y-touch routing line Y-TL driving the Y-touch electrode line Y-TEL disposed on the third sub-area SAA3 and the fourth sub-area SAA4.

In the case that the gate driving circuit 120 is disposed on both sides of the display panel 110, the gate pad GP can be disposed on the first pad area PA1 and the fourth pad area PA4.

The data pad DP and the touch pad TP can be disposed to be distributed on each area inside of the gate pad GP and can be disposed to be electrically connected to the data line DL or the touch routing line TL disposed on the active area AA.

Other than examples above-mentioned, the pads disposed on the pad area PA can be disposed as various structures for an effective connection to the display signal line DSL and the touch routing line TL.

The embodiments of the present disclosure described above will be briefly described as follows.

A touch display device 100 according to embodiments of the present disclosure can include a plurality of light-emitting elements ED disposed on an active area AA of a display panel 110, an encapsulation layer ENCAP disposed on the plurality of light-emitting elements ED, a plurality of touch electrodes TE disposed on the encapsulation layer ENCAP, a plurality of touch routing lines TL electrically connected to at least one of the plurality of touch electrodes TE, and a plurality of auxiliary routing patterns TLP disposed on the active area AA, positioned between the encapsulation layer ENCAP and the plurality of touch routing lines TL, and electrically connected to at least one of the plurality of touch routing lines TL on at least one point positioned on the active area AA.

A width of each of the plurality of auxiliary routing patterns TLP can be greater than a width of each of the plurality of touch routing lines TL.

Each of the plurality of touch routing lines TL can include at least one first opened portion corresponding to a light-emitting area of each of the plurality of light-emitting elements ED, and each of the plurality of auxiliary routing patterns TLP can include at least one second opened portion corresponding to the light-emitting area of each of the plurality of light-emitting elements ED, and a size of the first opened portion can be greater than a size of the second opened portion.

The touch display device 100 can further include a touch insulating layer TILD disposed between the plurality of touch routing lines TL and the plurality of auxiliary routing patterns TLP, and a touch insulating buffer layer TIBUF disposed between the encapsulation layer ENCAP and the plurality of auxiliary routing patterns TLP.

A thickness of the touch insulating layer TILD can be greater than a thickness of the touch insulating buffer layer TIBUF.

The touch insulating layer TILD can be an organic layer, and the touch insulating buffer layer TIBUF can be an inorganic layer.

The touch display device 100 can further include a touch buffer layer TBUF disposed between the encapsulation layer ENCAP and the plurality of auxiliary routing patterns TLP, and made of a same material as the touch insulating buffer layer TIBUF.

The touch display device 100 further include a plurality of touch electrode connecting patterns CL disposed on a same layer as a layer where the plurality of auxiliary routing patterns TLP are disposed, disposed to be separated from the plurality of auxiliary routing patterns TLP, and electrically connecting between two adjacent touch electrodes TE of the plurality of touch electrodes TE.

Each of the plurality of auxiliary routing patterns TLP can be disposed in a direction crossing each of the plurality of touch electrode connecting patterns CL.

A width of each of the plurality of auxiliary routing patterns TLP can be identical to a width of each of the plurality of touch electrode connecting patterns CL.

The active area AA can include a first sub-area SAA1 and a second sub-area SAA2 which are divided by a boundary of a first direction, and a touch routing line TL electrically connected to a touch electrode TE disposed on the first sub-area SAA1 and an auxiliary routing pattern TLP overlapped with the touch routing line TL can be disposed on the second sub-area SAA2.

The touch display device 100 can further include at least one dummy electrode DME disposed on at least a part area of the first sub-area SAA1 corresponding to an area where the touch routing line TL is disposed on the second sub-area SAA2.

The touch display device 100 can further include at least one dummy pattern DMP positioned on a same layer as a layer where the auxiliary routing pattern TLP is disposed, and overlapping the at least one dummy electrode DME.

A width of the at least one dummy pattern DMP can be greater than a width of at least one dummy electrode DME.

A width of the at least one dummy pattern DMP can be identical to a width of each of the plurality of auxiliary routing patterns TLP.

A touch display device 100 according to embodiments of the present disclosure includes an active area AA including a first sub-area SAA1 and a second sub-area SAA2, a plurality of touch electrodes TE disposed to be divided on each of the first sub-area SAA1 and the second sub-area SAA2, a plurality of touch routing lines TL electrically connected to at least one touch electrode TE disposed on the first sub-area SAA1, among the plurality of touch electrodes TE, and partially disposed on the second sub-area SAA2, and a plurality of auxiliary routing patterns TLP disposed on the second sub-area SAA2, electrically connected to an overlapping touch routing line TL among the plurality of touch routing lines TL, and having a larger width than a width of the overlapping touch routing line TL.

The touch display device 100 can further include at least one dummy electrode DME disposed on an area of the first sub-area SAA1 corresponding an area where the touch routing line TL is disposed on the second sub-area SAA2 and having an identical width to the touch routing line TL, and at least one dummy pattern DMP overlapping the at least one dummy electrode DME and having an identical width to the auxiliary routing pattern TLP.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device, comprising:
   a plurality of light-emitting elements disposed on an active area of a display panel;
   an encapsulation layer disposed on the plurality of light-emitting elements;
   a plurality of touch electrodes disposed on the encapsulation layer;
   a plurality of touch routing lines electrically connected to the plurality of touch electrodes; and
   a plurality of auxiliary routing patterns disposed on the active area and positioned between the encapsulation layer and the plurality of touch routing lines, an auxiliary routing pattern from the plurality of auxiliary routing patterns electrically connected to at least one of the plurality of touch routing lines at a point on the active area.

2. The touch display device of claim 1, wherein a width of at least one of the plurality of auxiliary routing patterns is greater than a width of at least one of the plurality of touch routing lines.

3. The touch display device of claim 1, wherein at least one of the plurality of touch routing lines includes at least one first opened portion corresponding to a light-emitting area of a corresponding one of the plurality of light-emitting elements, and at least one of the plurality of auxiliary routing patterns includes at least one second opened portion corresponding to the light-emitting area of the corresponding one of the plurality of light-emitting elements, and a size of the first opened portion is greater than a size of the second opened portion.

4. The touch display device of claim 1, further comprising:
   a touch insulating layer disposed between the plurality of touch routing lines and the plurality of auxiliary routing patterns; and
   a touch insulating buffer layer disposed between the touch insulating layer and the plurality of auxiliary routing patterns.

5. The touch display device of claim 4, wherein a thickness of the touch insulating layer is greater than a thickness of the touch insulating buffer layer.

6. The touch display device of claim 4, wherein the touch insulating layer is an organic layer, and the touch insulating buffer layer is an inorganic layer.

7. The touch display device of claim 4, further comprising:
   a touch buffer layer disposed between the encapsulation layer and the plurality of auxiliary routing patterns, the touch buffer layer comprising a same material as the touch insulating buffer layer.

8. The touch display device of claim 1, further comprising:

a plurality of touch electrode connecting patterns disposed on a same layer as the plurality of auxiliary routing patterns, the plurality of touch electrode connecting patterns separated from the plurality of auxiliary routing patterns, and a touch electrode connecting pattern from the plurality of touch electrode connecting patterns electrically connecting together two adjacent touch electrodes of the plurality of touch electrodes.

9. The touch display device of claim 8, wherein at least one of the plurality of auxiliary routing patterns is disposed in a direction crossing at least one of the plurality of touch electrode connecting patterns.

10. The touch display device of claim 8, wherein a width of at least one of the plurality of auxiliary routing patterns is substantially identical to a width of at least one of the plurality of touch electrode connecting patterns.

11. The touch display device of claim 1, wherein the active area includes a first sub-area and a second sub-area which are divided by a boundary along a first direction, and
wherein a touch routing line from the plurality of touch routing lines is electrically connected to a touch electrode from the plurality of touch electrodes disposed on the first sub-area, and an auxiliary routing pattern from the plurality of auxiliary routing patterns overlaps the touch routing line on the second sub-area but not the first sub-area.

12. The touch display device of claim 11, further comprising:
at least one dummy electrode disposed on at least a portion of the first sub-area that is aligned with an area where the touch routing line is disposed on the second sub-area.

13. The touch display device of claim 12, further comprising:
at least one dummy pattern positioned on a same layer as the auxiliary routing pattern, the at least one dummy pattern overlapping the at least one dummy electrode in the first sub-area.

14. The touch display device of claim 13, wherein a width of the at least one dummy pattern is greater than a width of at least one dummy electrode.

15. The touch display device of claim 13, wherein a width of the at least one dummy pattern is substantial identical to a width of at least one of the plurality of auxiliary routing patterns.

16. A touch display device, comprising:
an active area including a first sub-area and a second sub-area;
a plurality of touch electrodes divided on each of the first sub-area and the second sub-area;
a plurality of touch routing lines including a touch routing line electrically connected to at least one touch electrode from the plurality of touch electrodes disposed on the first sub-area, the touch routing line disposed in both the first sub-area and the second sub-area; and
a plurality of auxiliary routing patterns disposed on the second sub-area, the plurality of auxiliary routing patterns including an auxiliary routing pattern that is electrically connected to the touch routing line and overlapping the touch routing line in the second sub-area, the auxiliary routing pattern having a width that is greater than a width of the touch routing line.

17. The touch display device of claim 16, further comprising:
at least one dummy electrode disposed on an area of the first sub-area that is aligned with an area where the touch routing line is disposed on the second sub-area, the at least one dummy electrode having a width that is substantially the same as a width of the touch routing line; and
at least one dummy pattern overlapping the at least one dummy electrode, the at least one dummy pattern having a width that is substantially the same as a width of the auxiliary routing pattern.

18. A touch display device comprising:
an active area including a first sub-area and a second sub-area that is non-overlapping with the first sub-area;
a plurality of touch electrodes including a first touch electrode disposed in the first sub-area but not the second sub-area and a second touch electrode disposed in the second sub-area but not the first sub-area;
a plurality of touch routing lines including a first touch routing line connected to the first touch electrode and disposed in the first sub-area and the second sub-area, and a second touch routing line connected to the second touch electrode and disposed in the second sub-area but not the first sub-area; and
an auxiliary routing pattern disposed in the second sub-area but the not first sub-area, the auxiliary routing pattern electrically connected to the first touch routing line in the active area but not electrically connected the second touch routing line, and the auxiliary routing pattern overlapping the first touch routing line in the second sub-area without overlapping the second touch routing line.

19. The touch display device of claim 18, wherein a width of the auxiliary routing pattern is wider than a width of the first touch routing line.

20. The touch display device of claim 18, further comprising:
an insulating layer disposed between the auxiliary routing pattern and the first touch routing line.

* * * * *